US012593652B2

(12) United States Patent
Kang et al.

(10) Patent No.: US 12,593,652 B2
(45) Date of Patent: Mar. 31, 2026

(54) SELF-ASSEMBLY DEVICE

(71) Applicant: LG ELECTRONICS INC., Seoul (KR)

(72) Inventors: Byungjun Kang, Seoul (KR); Imdeok Jung, Seoul (KR); Philwon Yoon, Seoul (KR); Sungyun Park, Seoul (KR); Dohwan Yang, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 421 days.

(21) Appl. No.: 18/038,136

(22) PCT Filed: Nov. 23, 2020

(86) PCT No.: PCT/KR2020/016554
§ 371 (c)(1),
(2) Date: May 22, 2023

(87) PCT Pub. No.: WO2022/107945
PCT Pub. Date: May 27, 2022

(65) Prior Publication Data
US 2023/0361077 A1 Nov. 9, 2023

(51) Int. Cl.
H01L 23/00 (2006.01)
H01L 21/67 (2006.01)
(Continued)

(52) U.S. Cl.
CPC ........ H01L 24/97 (2013.01); H01L 21/67144 (2013.01); H01L 21/67742 (2013.01);
(Continued)

(58) Field of Classification Search
None
See application file for complete search history.

(56) References Cited

U.S. PATENT DOCUMENTS 5,904,545 A * 5/1999 Smith ................. H01L 21/6835
257/E23.008
7,080,444 B1 * 7/2006 Craig ................... H05K 13/027
257/E21.705
(Continued)

FOREIGN PATENT DOCUMENTS

KR 10-2017-0092670 A 8/2017
KR 10-2020-0026669 A 3/2020
KR 10-2160048 B1 9/2020

*Primary Examiner* — Nishath Yasmeen
(74) *Attorney, Agent, or Firm* — Birch, Stewart, Kolasch & Birch, LLP

(57) ABSTRACT

Discussed is a self-assembly apparatus that can include a chamber, at least one first supply part configured to supply a fluid to the chamber, a mounting part disposed on a first side of the chamber to mount a substrate to be inclined with respect to a horizontal plane of the chamber, the substrate having an assembly surface, and a magnet module disposed on an opposite surface of the substrate opposite to the assembly surface of the substrate, wherein the mounting part is configured to: insert the substrate into an upper side of the chamber, guide the inserted substrate from the upper side of the chamber toward a lower side of the chamber, and fix the guided substrate to the lower side of the chamber.

20 Claims, 25 Drawing Sheets

(51) Int. Cl.
    *H01L 21/677*       (2006.01)
    *H01L 21/683*       (2006.01)
    *H01L 25/075*       (2006.01)

(52) U.S. Cl.
    CPC .. *H01L 21/67754* (2013.01); *H01L 21/67757*
        (2013.01); *H01L 21/6835* (2013.01); *H01L*
            *25/0753* (2013.01); *H01L 2224/95085*
      (2013.01); *H01L 2224/95101* (2013.01); *H01L*
           *2224/95144* (2013.01); *H01L 2224/97*
          (2013.01); *H01L 2924/12041* (2013.01)

(56) References Cited

U.S. PATENT DOCUMENTS

| | | | | |
|---|---|---|---|---|
| 7,133,431 | B2 * | 11/2006 | Onozawa | G11B 7/1275 |
| | | | | 372/50.122 |
| 7,332,361 | B2 * | 2/2008 | Lu | H01L 25/50 |
| | | | | 257/E21.705 |
| 8,138,868 | B2 * | 3/2012 | Arnold | B81C 1/00007 |
| | | | | 29/729 |
| 8,390,537 | B2 * | 3/2013 | Hillis | G09F 9/30 |
| | | | | 345/55 |
| 10,361,337 | B2 * | 7/2019 | Ahmed | H10H 20/01 |
| 2004/0063233 | A1 * | 4/2004 | Onozawa | H01L 21/6835 |
| | | | | 257/E21.705 |
| 2005/0164485 | A1 * | 7/2005 | Onozawa | H01L 24/95 |
| | | | | 257/E21.705 |
| 2007/0007237 | A1 | 1/2007 | Wu et al. | |
| 2017/0154919 | A1 * | 6/2017 | Chen | H01L 21/6835 |
| 2019/0296184 | A1 * | 9/2019 | Ahmed | H10H 20/01 |
| 2021/0399160 | A1 | 12/2021 | Cho et al. | |
| 2022/0223437 | A1 | 7/2022 | Lee et al. | |

* cited by examiner

FIG. 5

SELF-ASSEMBLY DEVICE

CROSS REFERENCE TO RELATED APPLICATIONS

This application is the National Stage filing under 35 U.S.C. 371 of International Application No. PCT/KR2020/016554, filed on Nov. 23, 2020, the entire contents of which is hereby expressly incorporated by reference into the present application.

TECHNICAL FIELD

The embodiment relates to a self-assembling apparatus.

BACKGROUND ART

A display device displays a high-quality image by using a self-light emitting device such as a light emitting diode as a light source of a pixel. The light emitting diode has excellent durability, long lifespan, and high luminance even under harsh environmental conditions, and are in the limelight as a light source for next-generation display devices.

Recently, a super small-sized light emitting diode is manufactured using a material having a highly reliable inorganic crystal structure, and the super small-sized light emitting diode is disposed on a panel of a display device (hereinafter referred to as a "display panel") such that a light source is manufactured and research is being conducted to use it as a next-generation light source for pixel.

In order to implement high resolution, a size of pixel is gradually getting smaller, and a number of light emitting devices are arranged in the pixel of such a reduced size. Accordingly, research on the manufacture of super small-sized light emitting diode as small as micro or nano scale is being actively conducted.

Generally, a display panel includes millions of pixels. It is very difficult to align light emitting devices to each of millions of small-sized pixels. Accordingly, various studies on a method of aligning light emitting devices on a display panel have recently been actively in progress.

In general, ohmic characteristics between a semiconductor layer including an n-type dopant and an electrode in a light emitting device are not good. To solve this problem, an ohmic contact layer is formed between the semiconductor layer and the electrode. Typically, an ohmic contact layer is formed by reacting materials between the semiconductor layer and the electrode through a heat treatment process.

On the other hand, as the size of light emitting devices decreases, transferring these light emitting devices onto a substrate has emerged as a very important problem to be solved. Transfer technologies that have recently been developed include a pick and place process, a laser lift-off method, a self-assembly method or the like. In particular, the self-assembly method in which a light emitting device is transferred onto a substrate using a magnet has recently been in the limelight. The magnet is included in the light emitting device for self-assembly.

As shown in FIG. 1, in the self-assembly method, a substrate 3 having wire electrodes 4 and 5 is disposed parallel to a horizontal plane of the chamber (not shown). Then, the light emitting devices 7 and 8 are moved along the moving direction of the magnet 1 positioned on the substrate 3 such that the light emitting devices 7 and 8 are aligned in the corresponding assembly hole 2. The assembly hole 2 is located between wiring electrodes 4 and 5. The light emitting devices 7 and 8 are moved near the corresponding assembly hole 2 by the magnet 1, and the light emitting devices 7 and 8 are aligned in the corresponding assembly hole 2 by the dielectrophoretic force between the wiring electrodes 4 and 5.

Recently, as the demand for large-size displays increases, self-assembly on large-size substrates is required. When the substrate 3 of the 8th generation (2200 mm×2500 mm) or higher is disposed parallel to the horizontal plane of the chamber, a central region of the substrate 3 is bent downward by gravity.

In this way, when the magnet 1 is moved along the horizontal direction in a state where the central region of the substrate 3 is bent, the strength of the magnetic field by the magnet 1 near each assembly hole 2 of the substrate 3 varies according to the degree of bending of the substrate 3. For example, since the strength of the magnetic field by the magnet 1 near the assembly hole 2 located in the edge region of the substrate 3 is large, a relatively large number of light emitting devices 7 and 8 are movable along the magnet. However, since the magnetic field intensity by the magnet 1 near the assembly hole 2 located in the central region of the substrate 3 is small, a relatively small number of light emitting devices move along the magnet 1 or not move along the magnet 1 at all. For example, since the light emitting device 7 near the edge region of the substrate 3 where the warpage does not occur is relatively close to the magnet 1, a large magnetic field strength is applied by the magnet 1. Accordingly, the light emitting device 7 can be easily assembled in a desired assembly hole 2 by moving along the magnet 1. On the other hand, since the light emitting device 8 near the central region of the substrate 3 where the warpage occurs is relatively far from the magnet 1, a small magnetic field strength is applied by the magnet 1. Accordingly, the light emitting device 7 does not move along the magnet 1 or moves slowly such that it may not be assembled in the desired assembly hole 2 or it may be difficult to assemble.

Therefore, since the number of self-assembled light emitting devices varies according to the position of the substrate 3, there is a problem in that the luminance of each pixel becomes non-uniform. In addition, there is a problem in that it is difficult to secure high luminance because the light emitting devices are not aligned pixel by pixel as desired.

On the other hand, recently, the number of magnets 1 has been increased in order to speed up self-assembly. However, as the number of magnets 1 increases, the weight of all magnets increases. Thus, the magnets 1 sag down and come into contact with the substrate 3 due to the weight of all the magnets. In this case, since vibration is induced due to the contact between the magnet 1 and the substrate 3, there was a problem with poor assembly characteristics.

DISCLOSURE

Technical Problem

An object of the embodiment is to solve the foregoing and other problems.

Another object of the embodiment is to provide a self-assembling device capable of securing uniform luminance for each pixel.

Another object of the embodiment is to provide a self-assembling device capable of securing high luminance.

Another object of the embodiment is to provide a self-assembly apparatus capable of improving the self-assembly speed.

Another object of the embodiment is to provide a self-assembling device capable of easily collect light emitting devices.

Another object of the embodiment is to provide a self-assembling device capable of reducing an occupied area.

Technical Solution

According to one aspect of the embodiment to achieve the above or other object, a self-assembly apparatus, comprising: a chamber; at least one first supply part configured to supply fluid to the chamber; a mounting part disposed on a first side of the chamber to mount an assembly surface of a substrate so as not to be parallel to a horizontal plane of the chamber; and a magnet module disposed on an opposite surface opposite to the assembly surface of the substrate.

Advantageous Effects

Effects of the self-assembling device according to the embodiment are described as follows.

According to at least one of the embodiments, as shown in FIGS. 11 to 13, the substrate 200 is vertically disposed and the second length L2 of the second barrier rib 470 may be significantly smaller than the first length L1 of the first barrier rib 460. Thus, the occupied area of the self-assembly apparatus 400 according to the first embodiment is significantly reduced such that more self-assembly apparatus can be provided in a unit area. Therefore, it is possible to mass-produce the self-assembled substrates 200 by simultaneously performing the self-assembly process for the plurality of substrates 200. In addition, since the intensity of the magnetic field by the magnet module 450 applied to the entire region of the assembly surface 207 of the substrate 200 is constant, a uniform number of light emitting devices 150 for each pixel of the substrate 200 can be aligned. In addition, it is possible to secure uniform luminance for each pixel of the substrate 200. In addition, since a larger number of light emitting devices 150 are aligned on the substrate 200, high luminance can be secured. In addition, a desired number of light emitting devices 150 can be moved according to the movement of the magnet module 450 such that the self-assembly speed can be improved. In addition, the light emitting devices 150 that are not assembled on the substrate 200 are collected by a collection induction part 495 into the collection part 490, and the collected light emitting devices 150 are collected by the collection part 490. Therefore, it is easy to collect the light emitting device 150 and the collection rate can be increased.

According to at least one of the embodiments, as shown in FIG. 11, the substrate 200 is disposed vertically on the ground, and the magnet module 450 is also spaced apart from the substrate 200 so as to move vertically up, down, left and right with respect to the ground. Since the magnet module 450 is spaced apart in parallel with the substrate 200 and moved, vibration by the magnet module 450 is not transmitted to the substrate 200, and the assembly characteristics of the substrate 200 can be remarkably improved.

According to at least one of the embodiments, as shown in FIG. 22, the light emitting devices 150 are supplied to the chamber 410 through the second supply part 435 located in an upper side of the chamber 410, and the chamber. The light emitting devices 150 supplied to the chamber 410 may freely fall by gravity and be fixed to a specific area where the magnet module 450 is located. Accordingly, since the light emitting devices 150 can be easily supplied to the chamber 410 and also easily fixed to the magnet module 450, the self-assembly process can be efficiently performed, thereby shortening the process time and reducing the process cost.

As shown in FIG. 25, when the substrate 200 is disposed to be inclined at an acute angle θ1 with respect to the ground, the substrate 200 may be inclined toward the ground as in the direction of an arrow 532. However, according to at least one of the embodiments, since the fluid 510 is filled in the chamber 410, even if the substrate 200 is disposed to be inclined at an acute angle θ1 with respect to the ground, the substrate 200 is supported by the fluid 510 as in the direction of the arrow 531 such that the inclination of the substrate 200 does not occur. Therefore, since the same magnetic field intensity is formed on the assembly surface 207 in the entire region of the substrate 200, uniform luminance can be secured for each pixel, high luminance can be secured, and self-assembly speed can be improved. In addition, when the substrate 200 is disposed so as to be inclined at an acute angle θ1 with respect to the ground, even if a foreign substance that is not affected by the magnetic field falls due to gravity, it does not come into contact with the assembly surface 207 of the substrate 200. Therefore, it is possible to implement a high-quality display device by preventing contamination of the assembly surface 207 of the substrate 200.

According to at least one of the embodiments, as shown in FIG. 26, when the substrate 200 is disposed to be inclined at an obtuse angle θ2 with respect to the ground, the light emitting devices 150 supplied to the chamber 410 from an upper side of the chamber 410 may fall toward the assembly surface 207 of the substrate 200 and be assembled into the assembly hole 203 of the substrate 200. Accordingly, more and more light emitting devices 150 can be aligned per pixel such that higher luminance can be obtained. That is, the light emitting devices 150 may be assembled to the substrate 200 artificially and by free fall by the magnet module 450, and the substrate 200 may be disposed to have an obtuse angle θ2 with respect to the ground. Accordingly, more and more light emitting devices 150 can be assembled on the substrate 200 such that improved high luminance can be realized.

According to at least one of the embodiments, as shown in FIG. 27, first to third barrier ribs 460, 470, and 480 as well as a fourth barrier rib 481 may be provided. Accordingly, when the fluid 510 is filled in the accommodating space 550 formed by the first to fourth barrier ribs 481 of the chamber 410, the plurality of substrates 200 are sequentially mounted on the mounting part 440. And even if it is detached, since the fluid 510 of the chamber 410 is not discharged to the outside, the process time can be drastically shortened.

A further scope of applicability of the embodiment will become apparent from the detailed description that follows. However, since various changes and modifications within the spirit and scope of the embodiment can be clearly understood by those skilled in the art, it should be understood that the detailed description and specific embodiment, such as preferred embodiment, are given by way of example only.

DESCRIPTION OF DRAWINGS

FIG. 5 is a plan view showing the display panel of FIG. 3 in detail.

MODE FOR INVENTION

Figure 1:
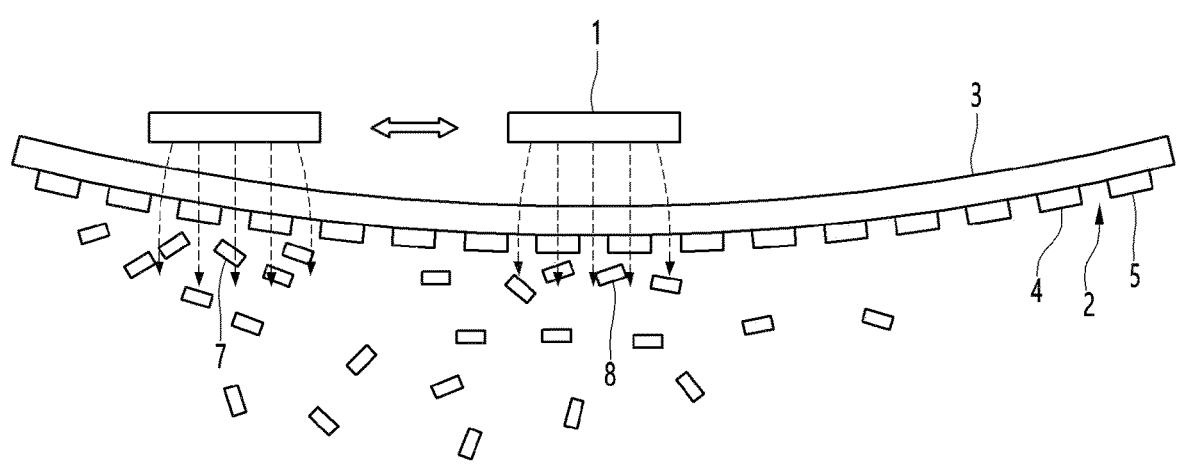
FIG. 1 shows a general self-assembly process.

Hereinafter, the embodiment disclosed in this specification will be described in detail with reference to the accompanying drawings, but the same or similar elements are given the same reference numerals regardless of reference numerals, and redundant descriptions thereof will be omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification is not limited by the accompanying drawings. Also, when an element such as a layer, region or substrate is referred to as being 'on' another element, this means that there may be directly on the other element or be other intermediate elements therebetween.

The display device described herein may comprise a mobile phone, a smart phone, a laptop computer, a digital broadcasting terminal, a personal digital assistant (PDA), a portable multimedia player (PMP), a navigation device, a slate PC, a tablet PC, an ultra-book device, a digital TV, a desktop computer, and the like. However, the configuration according to the embodiment described herein can be applied to a display-capable device even if it is a new product type to be developed in the future.

Hereinafter, a light emitting device according to an embodiment and a display device including the light emitting device will be described.

Figure 2:
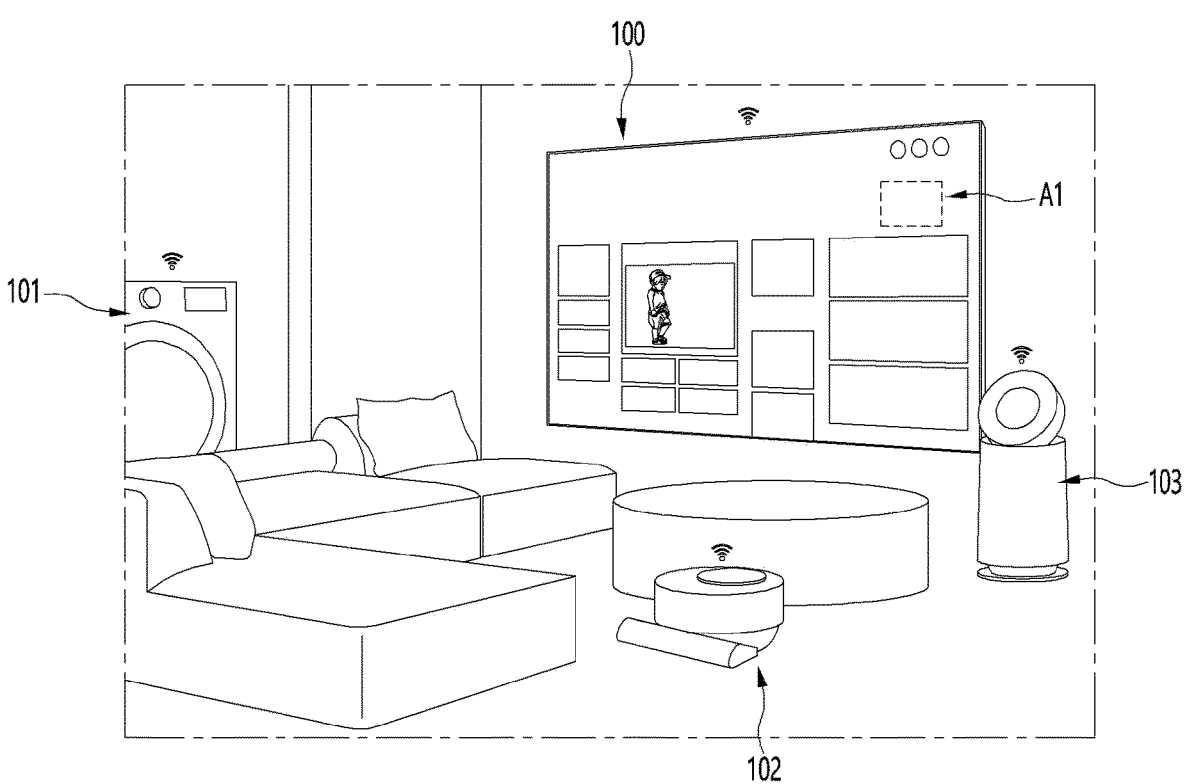
FIG. 2 illustrates a living room of a house in which a display device 100 according to an embodiment is disposed.

FIG. 2 illustrates a living room of a house in which a display device 100 according to an embodiment is disposed.

The display device 100 of the embodiment may display the status of various electronic products such as a washing machine 101, a robot cleaner 102, and an air purifier 103, communicate with each electronic product based on IOT and control each electronic product based on user's setting data.

The display device 100 according to the embodiment may include a flexible display fabricated on a thin and flexible substrate. The flexible display may be bent or rolled like paper while maintaining the characteristics of an existing flat panel display.

In the flexible display, visual information can be implemented by independently controlling light emission of a unit pixel arranged in a matrix form. The unit pixel means a minimum unit for implementing one color. The unit pixel of the flexible display may be implemented by a light emitting device. In the embodiment, the light emitting device may be Micro-LED or Nano-LED, but is not limited thereto.

Figure 3:
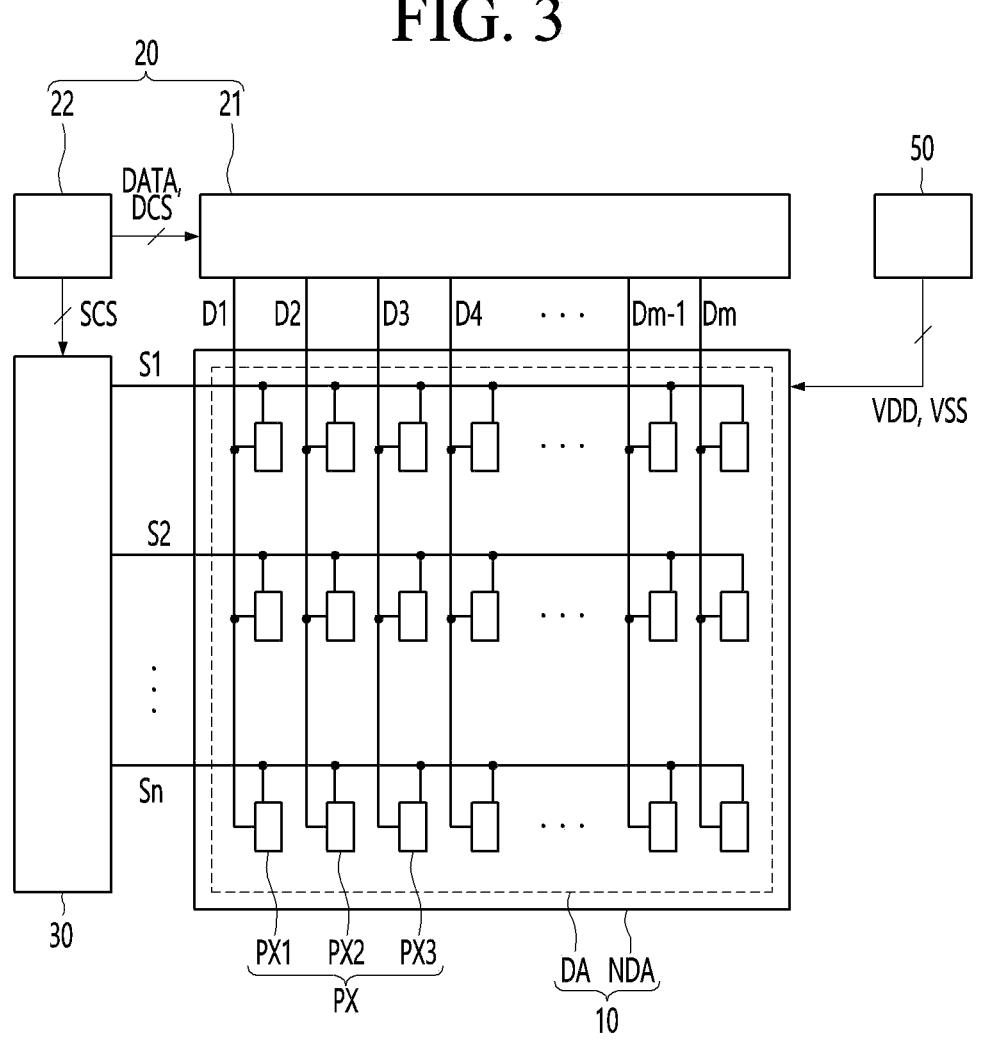
FIG. 3 is a schematic block diagram of a display device according to an embodiment.
Figure 4:
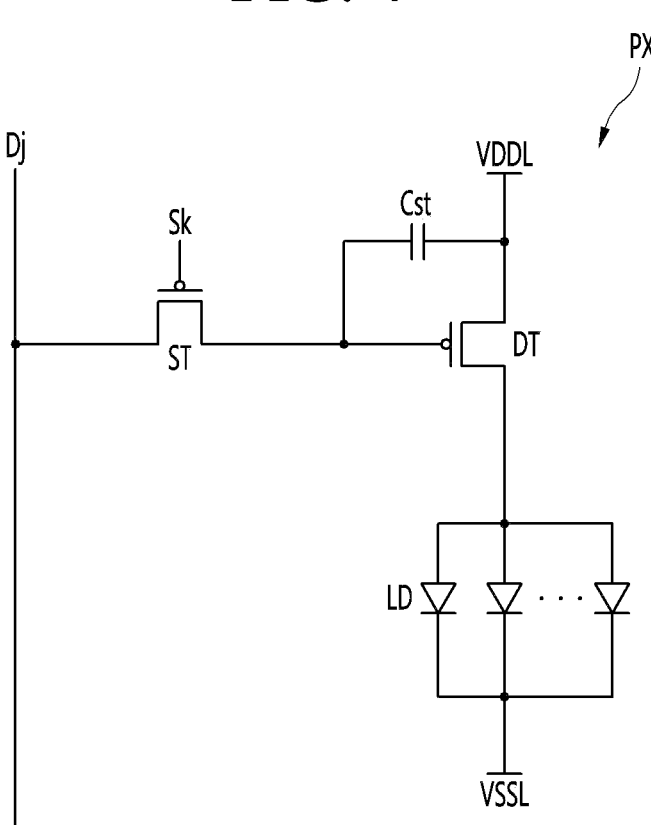
FIG. 4 is a circuit diagram illustrating an example of a pixel of FIG. 3.

FIG. 3 is a schematic block diagram of a display device according to an embodiment, and FIG. 4 is a circuit diagram illustrating an example of a pixel of FIG. 3.

Referring to FIG. 3 and FIG. 4, the display device according to an embodiment may comprise a display panel 10, a driving circuit 20, a scan driving circuit 30 and a power supply circuit 50.

The display device 100 according to the embodiment may drive a light emitting device in an active matrix (AM) method or a passive matrix (PM) method.

The driving circuit 20 may include a data driving circuit 21 and a timing controller 22. The display panel 10 may have a rectangular shape and a planar shape. The planar shape of the display panel 10 is not limited to the rectangular shape, and may be formed into polygonal, circular or elliptical shapes. At least one side of the display panel 10 may be formed to be bent with a predetermined curvature.

The display panel 10 may be divided into a display area DA and a non-display area NDA disposed around the display area DA. The display area DA is an area where the pixels PX are formed to display an image. The display panel 10 may comprise data lines (D1 to Dm, where m is an integer greater than or equal to 2), scan lines (S1 to Sn, where n is an integer greater than or equal to 2) crossing the data lines (D1 to Dm), a high potential voltage line VDDL supplied with a high potential voltage, a low potential voltage line VSSL supplied with a low potential voltage, and pixels PX connected to the data lines D1 to Dm and the scan lines S1 to Sn.

Each of the pixels PX may comprise a first sub-pixel PX1, a second sub-pixel PX2, and a third sub-pixel PX3. The first sub-pixel PX1 may emit a first color light, the second sub-pixel PX2 may emit of a second color light, and the third sub-pixel PX3 may emit a third color light. The first color light may be red light, the second color light may be green light, and the third color light may be blue light, but are not limited thereto. In addition, in FIG. 2, it is illustrated that each of the pixels PX comprise three sub-pixels, but are not limited thereto. That is, each of the pixels PX may comprise four or more sub-pixels.

Each of the first sub-pixel PX1, the second sub-pixel PX2, and the third sub-pixel PX3 may be connected to at least one of the data lines D1 to Dm, at least one of the scan lines S1 to Sn, and a high potential voltage line VDDL. As shown in FIG. 4, the first sub-pixel PX1 may include light emitting devices LDs, a plurality of transistors for supplying current to the light emitting devices LDs, and at least one capacitor.

Each of the light emitting devices LD may be an inorganic light emitting diode that includes a first electrode, an inorganic semiconductor, and a second electrode. Here, the first electrode may be an anode electrode, and the second electrode may be a cathode electrode.

The plurality of transistors may include a driving transistor DT supplying current to the light emitting devices LD and a scan transistor ST supplying a data voltage to a gate electrode of the driving transistor DT, as shown in FIG. 4. The driving transistor DT has a gate electrode connected to the source electrode of the scan transistor ST, a source electrode connected to the high potential voltage line VDDL to which a high potential voltage is applied, and a drain electrode connected to the first electrodes of the light emitting devices LD. The scan transistor ST has a gate electrode connected to the scan line (Sk, k is an integer that satisfies 1≤k≤n), a source electrode connected to the gate electrode of the driving transistor DT, and a drain electrode connected to the data lines (Dj, j an integer that satisfies 1≤j≤m).

The capacitor Cst is formed between the gate electrode and the source electrode of the driving transistor DT. The storage capacitor Cst stores a difference voltage between the gate voltage and the source voltage of the driving transistor DT.

The driving transistor DT and the scan transistor ST may be formed of a thin film transistor. In addition, in FIG. 4, the driving transistor DT and the scan transistor ST have been mainly described as being formed of P-type MOSFETs (Metal Oxide Semiconductor Field Effect Transistors), but are not limited thereto. The driving transistor DT and the scan transistor ST may be formed of N-type MOSFETs. In this case, positions of the source electrode and the drain electrode of each of the driving transistor DT and the scan transistor ST may be changed.

In addition, in FIG. 4, it is illustrated that each of the first sub-pixel PX1, the second sub-pixel PX2, and the third sub-pixel PX3 includes 2T1C (2 Transistor-1 capacitor) having one driving transistor DT, one scan transistor ST, and one capacitor Cst, but is not limited thereto. Each of the first sub-pixel PX1, the second sub-pixel PX2, and the third sub-pixel PX3 may include a plurality of scan transistors ST and a plurality of capacitors Cst.

Since the second sub-pixel PX2 and the third sub-pixel PX3 may be expressed with substantially the same circuit diagram as the first sub-pixel PX1, detailed descriptions will be omitted.

The driving circuit 20 outputs signals and voltages for driving the display panel 10. To this end, the driving circuit 20 may include a data driving circuit 21 and a timing controller 22.

The data driving circuit 21 receives digital video data DATA and a source control signal DCS from the timing controller 22. The data driving circuit 21 converts the digital video data DATA into analog data voltages according to the source control signal DCS and supplies them to the data lines D1 to Dm of the display panel 10.

The timing controller 22 receives digital video data DATA and timing signals from a host system. The timing signals may include a vertical synchronization signal, a horizontal synchronization signal, a data enable signal, and a dot clock. The host system may be an application processor of a smart phone or tablet PC, a system on chip of a monitor or TV, and the like.

The timing controller 22 generates control signals for controlling operation timings of the data driving circuit 21 and the scan driving circuit 30. The control signals may include a source control signal DCS for controlling the operation timing of the data driving circuit 21 and a scan control signal SCS for controlling the operation timing of the scan driving circuit 30.

The driving circuit 20 may be disposed in the non-display area NDA provided on one side of the display panel 10. The driving circuit 20 may be formed of an integrated circuit (IC) and mounted on the display panel 10 using a chip on glass (COG) scheme, a chip on plastic (COP) scheme, or an ultrasonic bonding scheme, but is not limited thereto. For example, the driving circuit 20 may be mounted on a circuit board (not shown) instead of the display panel 10.

The data driving circuit 21 may be mounted on the display panel 10 using a chip on glass (COG) scheme, a chip on plastic (COP) scheme, or an ultrasonic bonding scheme, and the timing controller 22 may be mounted on a circuit board.

The scan driving circuit 30 receives the scan control signal SCS from the timing controller 22. The scan driving circuit 30 generates scan signals according to the scan control signal SCS and supplies them to the scan lines S1 to Sn of the display panel 10. The scan driving circuit 30 may include a plurality of transistors and be formed in the non-display area NDA of the display panel 10. Alternatively, the scan driving circuit 30 may be formed as an integrated circuit, and in this case, it may be mounted on a gate flexible film attached to the other side of the display panel 10.

The circuit board may be attached to pads provided on one edge of the display panel 10 using an anisotropic conductive film. For this reason, the lead lines of the circuit board may be electrically connected to the pads. The circuit board may be a flexible printed circuit board, a printed circuit board, or a flexible film such as a chip on film. The circuit board may be bent under the display panel 10. Accordingly, one side of the circuit board may be attached to one edge of the display panel 10 and the other side may be disposed below the display panel 10 and connected to a system board on which a host system is mounted.

The power supply circuit 50 may generate voltages necessary for driving the display panel 10 from the main power supplied from the system board and supply the voltages to the display panel 10. For example, the power supply circuit 50 generates a high potential voltage VDD and a low potential voltage VSS for driving the light emitting devices LD of the display panel 10 from the main power supply to supply them to the high potential voltage line VDDL and the low potential voltage line VSSL. Also, the power supply circuit 50 may generate and supply driving voltages for driving the driving circuit 20 and the scan driving circuit 30 from the main power.

Figure 5:
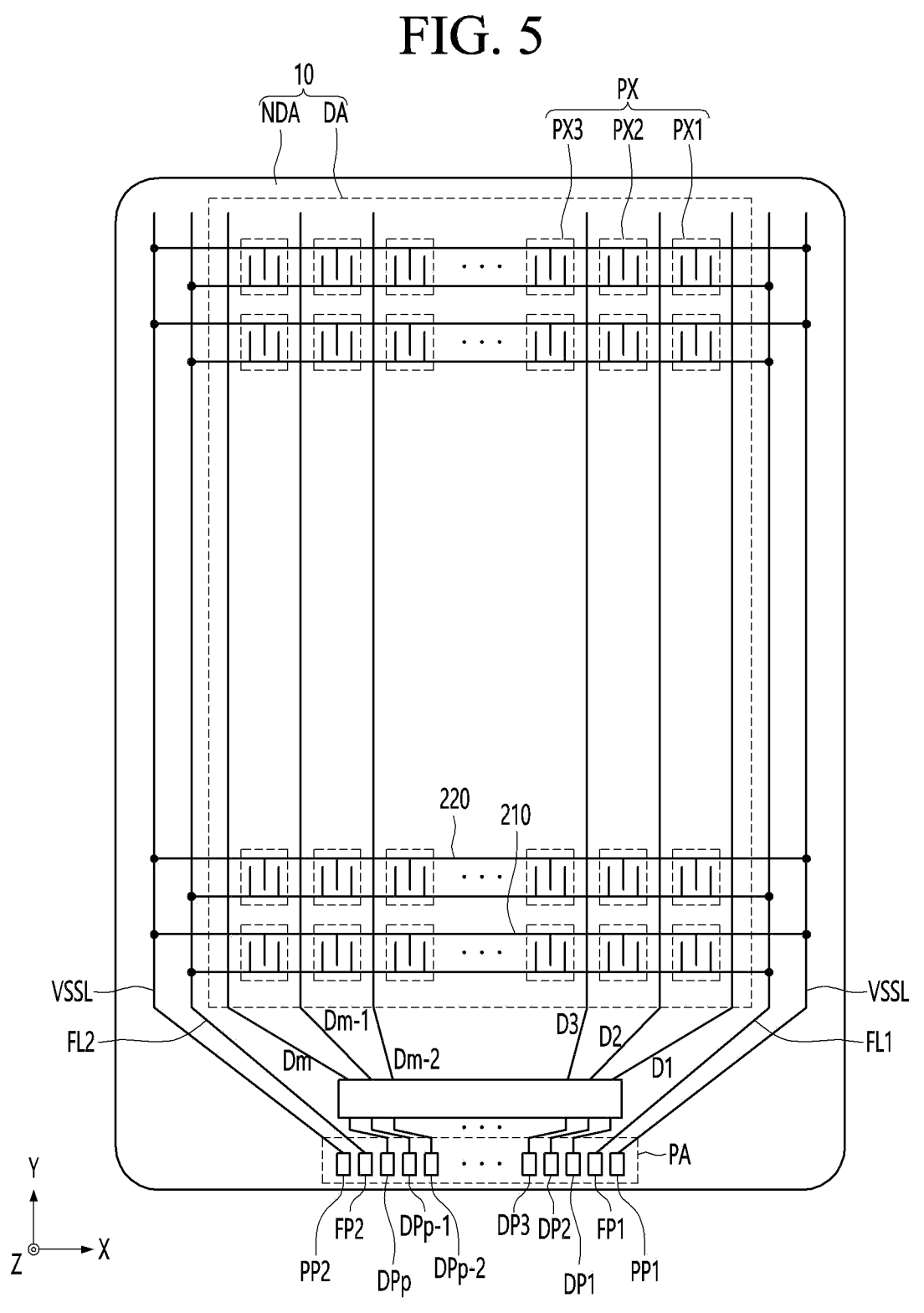

FIG. 5 is a plan view showing the display panel of FIG. 3 in detail. In FIG. 5, for convenience of description, data pads (DP1 to DP$_p$, including DP$_{p-1}$, DP$_{p-2}$, where p is an integer greater than or equal to 2), floating pads FP1 and FP2, power pads PP1 and PP2, floating lines FL1 and FL2, low potential voltage line VSSL, data lines D1 to Dm, first electrodes 260 and second electrodes 220 are shown.

Referring to FIG. 5, the data lines D1 to Dm, the first electrodes 210, the second electrodes 220, and the pixels PX may be disposed in the display area DA of the display panel 10.

The data lines D1 to Dm may extend long in the second direction (Y-axis direction). One sides of the data lines D1 to Dm may be connected to the driving circuit 20. For this reason, the data voltages of the driving circuit 20 may be applied to the data lines D1 to Dm.

The first electrodes 210 may be spaced apart from each other at predetermined intervals in the first direction (X-axis direction). For this reason, the first electrodes 210 may not overlap the data lines D1 to Dm. Among the first electrodes 210, the first electrodes 210 disposed on the right edge of the display area DA may be connected to the first floating line FL1 in the non-display area NDA. Among the first electrodes 210, the first electrodes 210 disposed at the left edge of the display area DA may be connected to the second floating line FL2 in the non-display area NDA.

Each of the second electrodes 220 may extend long in the first direction (X-axis direction). For this reason, the second electrodes 220 may overlap the data lines D1 to Dm. Also, the second electrodes 220 may be connected to the low potential voltage line VSSL in the non-display area NDA. For this reason, the low potential voltage of the low potential voltage line VSSL may be applied to the second electrodes 220.

Each of the pixels PX may comprise a first sub-pixel PX1, a second sub-pixel PX2, and a third sub-pixel PX3. The first sub-pixel PX1, the second sub-pixel PX2, and the third sub-pixel PX3 of each of the pixels PX may be arranged in regions defined in a matrix form by the first electrodes 210, the second electrodes 220, and data lines D1 to Dm. Although FIG. 5 illustrates that the pixel PX comprises three sub-pixels, it is not limited thereto, and each of the pixels PX may comprise four or more sub-pixels.

The first sub-pixel PX1, the second sub-pixel PX2, and the third sub-pixel PX3 of each of the pixels PX may be disposed in the first direction (X-axis direction), but are not limited thereto. That is, the first sub-pixel PX1, the second sub-pixel PX2, and the third sub-pixel PX3 of each of the pixels PX are disposed in the second direction (Y-axis direction) or in a zigzag shape and may be arranged in a variety of other forms.

The first sub-pixel PX1 may emit a first color light, the second sub-pixel PX2 may emit a second color light, and the third sub-pixel PX3 may emit a third color light. The first color light may be red light, the second color light may be green light, and the third color light may be blue light, but are not limited thereto.

In the non-display area NDA of the display panel 10, a pad part PA including data pads DP1 to DP$_p$, floating pads FD1 and FD2, and power pads PP1 and PP2, and a driving circuit 20, a first floating line FL1, a second floating line FL2, and a low potential voltage line VSSL may be disposed.

The pad part PA including the data pads DP1 to DP$_p$, the floating pads FD1 and FD2, and the power pads PP1 and PP2 may be disposed in one edge of the display panel 10, for example, an edge of the lower side. The data pads DP1 to DP$_p$, the floating pads FD1 and FD2, and the power pads PP1 and PP2 may be disposed side by side in the first direction (X-axis direction) of the pad part PA.

A circuit board may be attached using an anisotropic conductive film on the data pads DP1 to DP$_p$, the floating pads FD1 and FD2, and the power pads PP1 and PP2. Accordingly, the circuit board, the data pads DP1 to DP$_p$, the floating pads FD1 and FD2, and the power pads PP1 and PP2 may be electrically connected.

The driving circuit 20 may be connected to the data pads DP1 to DP$_p$ through the link lines LL. The driving circuit 20 may receive digital video data DATA and timing signals through the data pads DP1 to DP$_p$. The driving circuit 20 may convert the digital video data DATA into analog data voltages and supply them to the data lines D1 to Dm of the display panel 10.

The low potential voltage line VSSL may be connected to the first power pad PP1 and the second power pad PP2 of the pad part PA. The low potential voltage line VSSL may extend long in the second direction (Y-axis direction) in the non-display area NDA located in the left outside and the right outside of the display area DA. The low potential voltage line VSSL may be connected to the second pad electrode 220. For this reason, the low potential voltage of the power supply circuit 50 is applied to the second pad electrode 220 through the circuit board, the first power pad PP1, the second power pad PP2 and the low potential voltage line VSSL.

The first floating line FL1 may be connected to the first floating pad FD1 of the pad part PA. The first floating line FL1 may extend long in the second direction (Y-axis direction) in the non-display area NDA located in the left outside and the right outside of the display area DA.

The first floating pad FD1 and the first floating line FL1 may be dummy pads or dummy lines to which no voltage is applied.

The second floating line FL2 may be connected to the second floating pad FD2 of the pad part PA. The first floating line FL1 may extend long in the second direction (Y-axis direction) in the non-display area NDA located in the left outside and the right outside of the display area DA.

The second floating pad FD2 and the second floating line FL2 may be dummy pads or dummy lines to which no voltage is applied.

Meanwhile, since the light emitting devices (300 in FIG. 6) have a very small size, it is difficult that they are mounted on the first sub-pixel PX1, the second sub-pixel PX2, and the third sub-pixel PX3 of each of the pixels PX.

In order to solve this problem, an alignment method using a dielectrophoresis scheme has been proposed.

That is, an electric field may be formed in each of the first sub-pixel PX1, the second sub-pixel PX2, and the third sub-pixel PX3 of the pixels PX to align the light emitting devices 300 during the manufacturing process. Specifically, the light emitting devices 300 may be aligned by applying a dielectrophoretic force to the light emitting devices 300 using a dielectrophoresis scheme during a manufacturing process.

However, during the manufacturing process, it is difficult to apply a ground voltage to the first electrodes 210 by driving the thin film transistors.

Therefore, in the manufactured display device, the first electrodes 210 may be spaced apart at predetermined intervals in a first direction (X-axis direction), but during the manufacturing process, the first electrodes 210 may be not disconnected in a first direction (X-axis direction) and n be extended and may be disposed to extend long.

For this reason, the first electrodes 210 may be connected to the first floating line FL1 and the second floating line FL2 during the manufacturing process. Therefore, the first electrodes 210 may receive a ground voltage through the first floating line FL1 and the second floating line FL2. Accordingly, by disconnecting the first electrodes 210 after aligning the light emitting devices 300 using a dielectrophoresis scheme during the manufacturing process, the first electrodes 210 may be spaced apart at predetermined intervals in the first direction (X-axis direction).

Meanwhile, the first floating line FL1 and the second floating line FL2 are lines for applying a ground voltage during a manufacturing process, and no voltage may be applied in the manufactured display device. Alternatively, the ground voltage may be applied to the first floating line FL1 and the second floating line FL2 to prevent static electricity in the manufactured display device.

Figure 6:
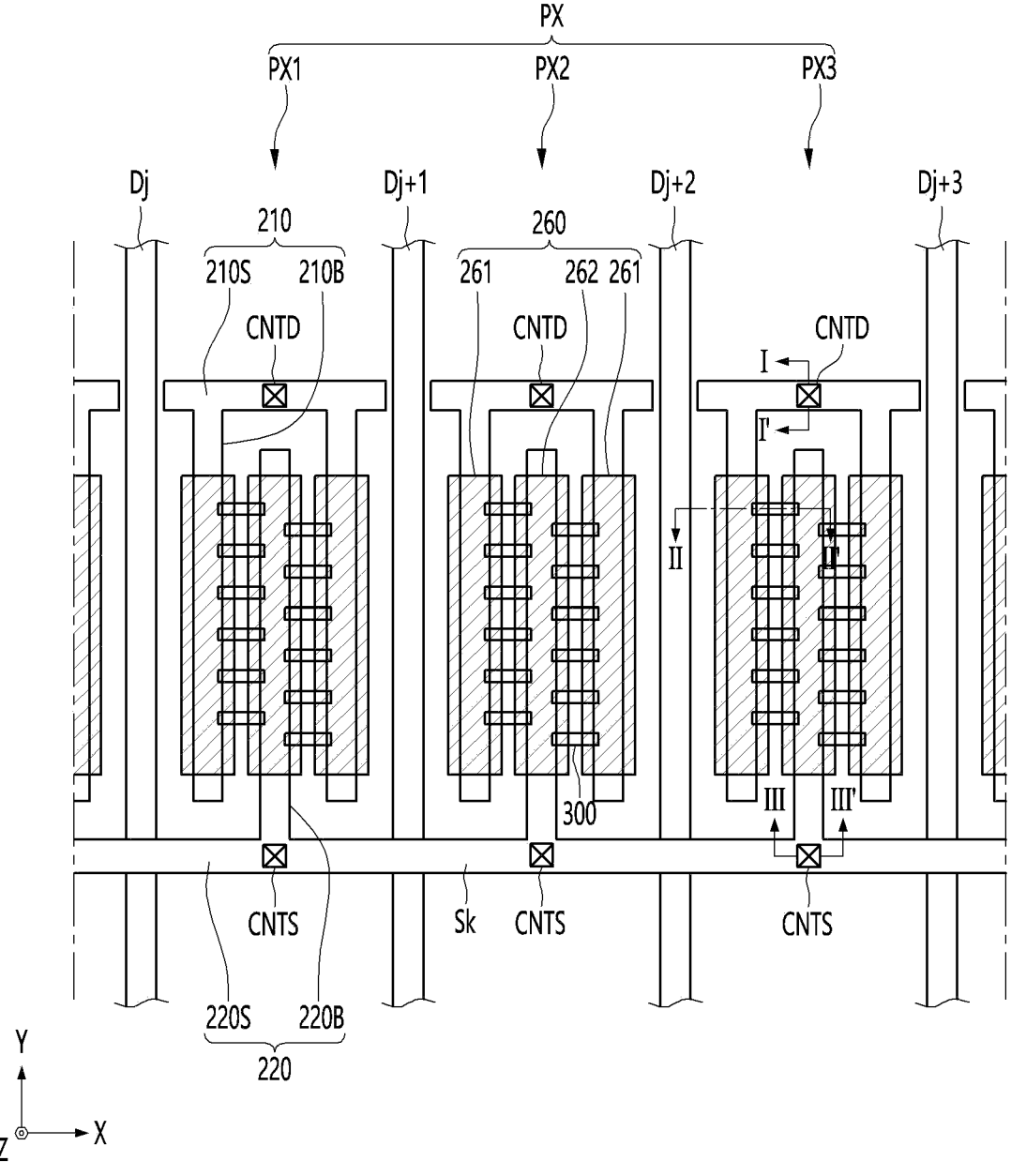
FIG. 6 is a plan view showing a pixel of the display area of FIG. 5 in detail.

FIG. 6 is a plan view showing a pixel of the display area of FIG. 5 in detail.

Referring to FIG. 6, the pixel PX may comprise a first sub-pixel PX1, a second sub-pixel PX2, and a third sub-pixel PX3. The first sub-pixel PX1, the second sub-pixel PX2, and the third sub-pixel PX3 of each of the pixels PX may be arranged in a matrix form in regions defined by the intersection structure of the scan lines Sk and the data lines Dj, Dj+1, and Dj+2, Dj+3.

The scan lines Sk may extend long in a first direction (X-axis direction), and the data lines Dj, Dj+1, Dj+2, and Dj+3 may extend long in the second direction (Y-axis direction) crossing the first direction (X-axis direction).

Each of the first sub-pixel PX1, the second sub-pixel PX2, and the third sub-pixel PX3 may comprise a first pad electrode 210, a second pad electrode 220, and a plurality of light emitting devices 300. The first pad electrode 210 and the second pad electrode 220 may be electrically connected to the light emitting devices 300 and may receive voltages to emit light of the light emitting device 300.

The first pad electrode 210 of any one sub-pixel among the first sub-pixel PX1, the second sub-pixel PX2, and the third sub-pixel PX3 may be spaced apart from the first pad electrode 210 of sub-pixel adjacent to the one sub-pixel. For example, the first pad electrode 210 of the first sub-pixel PX1 may be spaced apart from the first pad electrode 210 of the second sub-pixel PX2 adjacent thereto. Also, the first pad electrode 210 of the second sub-pixel PX2 may be spaced apart from the first pad electrode 210 of the third sub-pixel PX3 adjacent thereto. Also, the first pad electrode 210 of the third sub-pixel PX3 may be spaced apart from the first pad electrode 210 of the first sub-pixel PX1 adjacent thereto.

In contrast, the second pad electrode 220 of any one sub-pixel among the first sub-pixel PX1, the second sub-pixel PX2, and the third sub-pixel PX3 may be connected to the second pad electrode 220 of sub-pixel adjacent to the one sub-pixel. For example, the second pad electrode 220 of the first sub-pixel PX1 may be connected to the second electrode 210 of the adjacent second sub-pixel PX2. Also, the second pad electrode 220 of the second sub-pixel PX2 may be connected to the second pad electrode 220 of the third sub-pixel PX3 adjacent thereto. Also, the second pad electrode 220 of the third sub-pixel PX3 may be connected to the second pad electrode 220 of the first sub-pixel PX1 adjacent thereto.

In addition, during the manufacturing process, the first pad electrode 210 and the second pad electrode 220 may be used to form an electric field in each of the first sub-pixel PX1, the second sub-pixel PX2, and the third sub-pixel (PX3) to align the light emitting device 300. Specifically, the light emitting devices 300 may be aligned by applying a dielectrophoresis force to the light emitting devices 300 using a dielectrophoresis scheme during the manufacturing process. An electric field is formed by the voltage applied to the first pad electrode 210 and the second pad electrode 220, and a dielectrophoretic force is formed by the electric field such that the dielectrophoretic force can be applied to the light emitting device 300.

The first pad electrode 210 is an anode electrode connected to the second conductivity type semiconductor layer of the light emitting devices 300, and the second pad electrode 220 is a cathode electrode connected to the first conductivity type semiconductor layer of the light emitting devices 300. The first conductivity type semiconductor layer of the light emitting devices 300 may be an n-type semiconductor layer, and the second conductivity type semiconductor layer may be a p-type semiconductor layer. However, the present invention is not limited thereto, and the first pad electrode 210 may be a cathode electrode and the second pad electrode 220 may be an anode electrode.

The first pad electrode 210 may include a first electrode stem 210S extending long in a first direction (X-axis direction) and at least one first electrode branch 210B branching from the first electrode stem 210S in a second direction (Y-axis direction). The second pad electrode 220 may include a second electrode stem 220S extending long in a first direction (X-axis direction) and at least one second electrode branch 220B branching from the second electrode stem 220S in a second direction (Y-axis direction).

The first electrode stem 210S may be electrically connected to the thin film transistor 120 through the first electrode contact hole CNTD.

For this reason, the first electrode stem 210S may receive a predetermined driving voltage through the thin film transistor 120. The thin film transistor 120 to which the first electrode stem 210S is connected may be the driving transistor DT shown in FIG. 4.

The second electrode stem 220S may be electrically connected to the low potential auxiliary wire 161 through the second electrode contact hole CNTS.

Accordingly, the second electrode stem 220S may receive a low potential voltage of the low potential auxiliary wire 161. In FIG. 6, the second electrode stem 220S may be connected to the low potential auxiliary wire 161 through the second electrode contact hole CNTS in each of the first sub-pixel PX1, the second sub-pixel PX2, and the third sub-pixel PX3 of the pixel PX, but the present invention is not limited thereto. For example, the second electrode stem 220S may be connected to the low potential auxiliary wire 161 through the electrode contact hole CNTS in any one of the first sub-pixel PX1, the second sub-pixel PX2, and the third sub-pixel PX3 of the pixel PX. Alternatively, as shown in FIG. 4, since the second electrode stem 220S is connected to the low potential voltage line VSSL of the non-display area NDA, it may not be connected to the low potential auxiliary line 161. That is, the second electrode contact hole CNTS may be omitted.

The first electrode stem 210S of one sub-pixel may be disposed parallel to the first electrode stem 210S of sub-pixel adjacent to the one sub-pixel in a first direction (X-axis direction) in a first direction (X-axis direction). For example, the first electrode stem 210S of the first sub-pixel PX1 is disposed parallel to the first electrode stem 210S of the second sub-pixel PX2 in the first direction (X-axis direction). The first electrode stem 210S of the second sub-pixel PX2 is disposed parallel to the first electrode stem 210S of the third sub-pixel PX3 in the first direction (X-axis direction). The first electrode stem 210S of the third sub-pixel PX3 may be disposed parallel to the first electrode stem 210S of the first sub-pixel PX1 in the first direction (X-axis direction). This is because the first electrode stems 210S were connected as one during the manufacturing process, and then disconnected through a laser process after the light emitting devices 300 were aligned.

The second electrode branch 220B may be disposed between the first electrode branch 210B. The first electrode branches 210B may be symmetrically disposed with respect to the second electrode branches 220B. In FIG. 6, each of the first sub-pixel PX1, the second sub-pixel PX2, and the third sub-pixel PX3 of the pixel PX includes two first electrode branches 220B, but the present invention is not limited thereto. For example, each of the first sub-pixel PX1, the second sub-pixel PX2, and the third sub-pixel PX3 of the pixel PX may include three or more first electrode branches 220B.

In addition, in FIG. 6, each of the first sub-pixel PX1, the second sub-pixel PX2, and the third sub-pixel PX3 of the pixel PX includes one second electrode branch 220B, but the present invention is not limited thereto. For example, when each of the first sub-pixel PX1, the second sub-pixel PX2, and the third sub-pixel PX3 of the pixel PX includes a plurality of second electrode branches 220B, the first electrode branch 210B may be disposed between the second electrode branch 220B. That is, in each of the first sub-pixel PX1, the second sub-pixel PX2, and the third sub-pixel PX3 of the pixel PX, the first electrode branch 210B, the second electrode branch 220B, the first electrode branch 210B and the second electrode branch 220B may be sequentially arranged in the first direction (X-axis direction).

The plurality of light emitting devices 300 may be disposed between the first electrode branch 210B and the second electrode branch 220B. One end of at least one light emitting device 300 among the plurality of light emitting devices 300 is disposed to overlap the first electrode branch 210B, and the other end is disposed to overlap the second electrode branch 220B. A second conductivity type semiconductor layer, which is a p-type semiconductor layer, may be disposed at one end of each of the plurality of light emitting devices 300, and a first conductivity type semiconductor layer, which is an n-type semiconductor layer, may be disposed at the other end, but is not limited thereto. For example, a first conductivity type semiconductor layer, which is an n-type semiconductor layer, may be disposed at one end of the plurality of light emitting devices 300, and a second conductivity type semiconductor layer, which is a p-type semiconductor layer, may be disposed at the other end.

The plurality of light emitting devices 300 may be disposed substantially side by side in the first direction (X-axis direction). The plurality of light emitting devices 300 may be spaced apart from each other in the second direction (Y-axis direction). In this case, the spacing interval between the plurality of light emitting devices 300 may be different from each other. For example, some of the plurality of light emitting devices 300 may be adjacently disposed to form one group, and the remaining light emitting devices 300 may be adjacently disposed to form another group.

A connection electrode 260 may be disposed on the first electrode branch 210B and the second electrode branch 220B, respectively. The connection electrodes 260 may be disposed to extend long in the second direction (Y-axis direction) and spaced apart from each other in the first direction (X-axis direction). The connection electrode 260 may be connected to one end of at least one light emitting device 300 among the light emitting devices 300. The connection electrode 260 may be connected to the first pad electrode 210 or the second pad electrode 220.

The connection electrode 260 may include a first connection electrode 261 disposed on the first electrode branch 210B and connected to one end of at least one light emitting device 300 of the light emitting devices 300, and a second connection electrode 262 disposed on the branch portion 220B and connected to one end of at least one light emitting device 300 of the light emitting devices 300. For this reason, the first connection electrode 261 serves to electrically connect the plurality of light emitting devices 300 to the first pad electrode 210, and the second connection electrode 262 serves to electrically connect the plurality of light emitting devices 300 to the second pad electrode 220.

A width of the first connection electrode 261 in the first direction (X-axis direction) may be greater than a width of the first electrode branch 210B in the first direction (X-axis direction). Also, the width of the second connection electrode 262 in the first direction (X-axis direction) may be greater than the width of the second electrode branch 220B in the first direction (X-axis direction).

For example, each end of the light emitting devices 300 is disposed on the first electrode branch 210B of the first pad electrode 210 and the second electrode branch 220B of the second pad electrode 220, but due to an insulating layer (not shown) formed on the first pad electrode 210 and the second pad electrode 220, the light emitting device 300 may not be electrically connected to the first pad electrode 210 and the second pad electrode 220. Accordingly, portions of a side surface and/or an upper surface of the light emitting device 300 may be electrically connected to the first connection electrode 261 and the second connection electrode 262, respectively.

Figure 7:
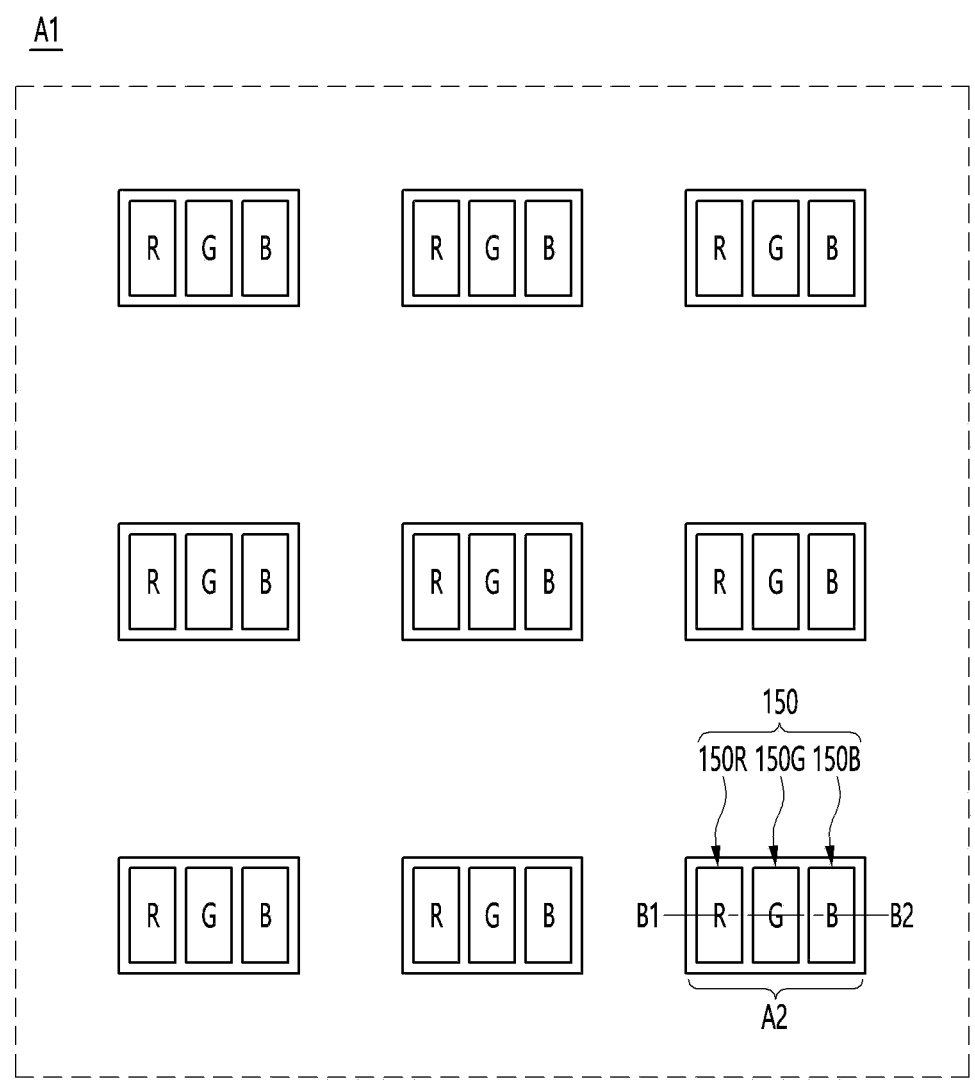
FIG. 7 is an enlarged view of a first panel region in the display device of FIG. 2.

FIG. 7 is an enlarged view of a first panel region in the display device of FIG. 2.

Referring to FIG. 7, a display device 100 of the embodiment may be manufactured by mechanically and electrically connecting a plurality of panel regions such as the first panel region A1 by tiling.

The first panel region A1 may include a plurality of light emitting devices 150 arranged for each unit pixel (PX in FIG. 3). The light emitting device 150 may be the light emitting device 300 of FIG. 6.

The light emitting device 150 may comprise, for example, a red light emitting device 150R, a green light emitting device 150G, and a blue light emitting device 150B. For example, the unit pixel PX may include a first sub-pixel PX1, a second sub-pixel PX2, and a third sub-pixel PX3. For example, a plurality of red light emitting devices 150R may be disposed on the first sub-pixel PX1, a plurality of green light emitting devices 150G may be disposed on the second sub-pixel PX2, and a plurality of blue light emitting devices 150B may be disposed on the third sub-pixel PX3. The unit pixel PX may further include a fourth sub-pixel in which no light emitting device is disposed, but is not limited thereto.

Figure 8:
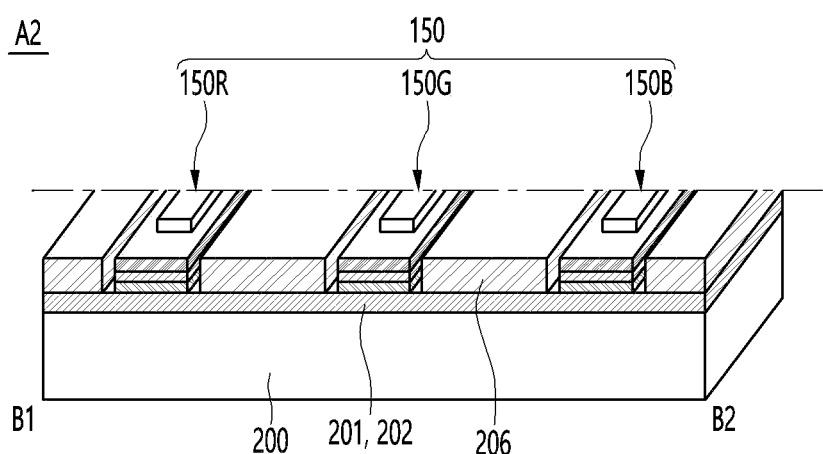
FIG. 8 is an enlarged view of area A2 of FIG. 7.

FIG. 8 is an enlarged view of area A2 of FIG. 7.

Referring to FIG. 8, a display device 100 according to an embodiment may comprise a substrate 200, wiring electrodes 201 and 202, an insulating layer 206, and a plurality of light emitting devices 150.

The wiring electrode may comprise a first wiring electrode 201 and a second wiring electrode 202 spaced apart from each other.

The light emitting device 150 may comprise, a red light emitting device 150R, a green light emitting device 150G, and a blue light emitting device 150B, but is not limited thereto. The light emitting device 150 may emit red and green colors by including a red phosphor, a green phosphor or the like. A sub-pixel may be defined by the red light emitting device 150R, the green light emitting device 150G, and the blue light emitting device 150B.

The substrate 200 may be formed of glass or polyimide. In addition, the substrate 200 may comprise a flexible material such as polyethylene naphthalate (PEN), polyethylene terephthalate (PET) or the like. In addition, the substrate 200 may be a transparent material, but is not limited thereto.

The insulating layer 130 may comprise an insulating and/or flexible material such as polyimide, PEN, PET, or the like, and may be integrally formed with the substrate 200 to form a single substrate.

The insulating layer 130 may be a conductive adhesive layer having adhesiveness and/or conductivity, and the conductive adhesive layer may have flexibility to enable a flexible function of the display device. For example, the insulating layer 130 may be an anisotropy conductive film (ACF) or a conductive adhesive layer such as an anisotropic conductive medium, a solution containing conductive particles or the like. The conductive adhesive layer may be a layer that is electrically conductive in a direction perpendicular to the thickness thereof, but electrically insulating in a direction horizontal to the thickness thereof.

The insulating layer 130 may comprise an assembly hole (not shown) into which the light emitting device 150 is inserted. Therefore, during self-assembly, the light emitting device 150 can be easily inserted into the assembly hole of the insulating layer 130.

Figure 9:
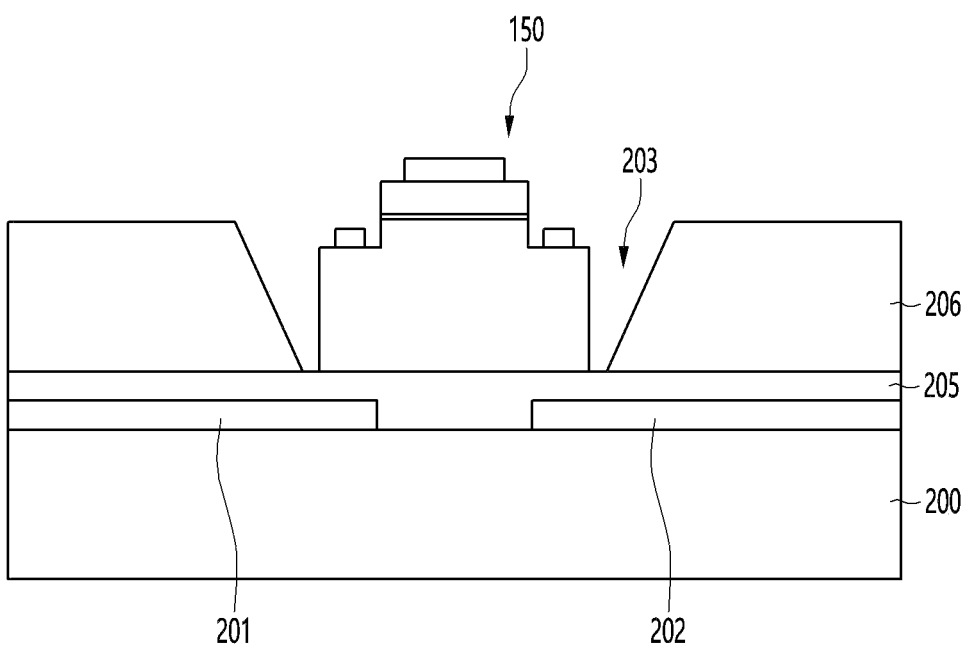
FIG. 9 shows a state in which a light emitting device is inserted into a substrate by a self-assembly method.

FIG. 9 shows a state in which a light emitting device is inserted into a substrate by a self-assembly method.

As shown in FIG. 9, the light emitting device 150 may be pulled by the magnet (not shown) of the assembly device and inserted into an assembly hole 203 of the substrate 200.

The first wiring electrode 201 and the second wiring electrode 202 may be spaced apart from each other on the substrate 200.

An insulating layer 205 may be disposed on the first wire electrode 201 and the second wire electrode 202, and an insulating layer 206 may be disposed on the insulating layer 205. For convenience, each of the insulating layer 205 and the insulating layer 206 may be referred to as a first insulating layer and a second insulating layer.

The first insulating layer 205 and the second insulating layer 206 may be formed of the same material or different materials, but are not limited thereto. For example, the first insulating layer 205 may be formed of an inorganic material and the second insulating layer 206 may be formed of an organic material, but may be formed conversely.

The second insulating layer 206 may be provided with the assembly hole 203 into which the light emitting device 150 may be inserted. An upper surface of the first insulating layer 205 may be exposed through the assembly hole 203 of the second insulating layer 206.

When the light emitting device 150 is inserted into the assembly hole 203, a lower surface of the light emitting device may come into contact with the upper surface of the first insulating layer 205 exposed through the assembly hole 203.

For example, a voltage may be applied to the first wiring electrode 201 and the second wiring electrode 202 to form an electric field between the first wiring electrode 201 and the second wiring electrode 202. The dielectrophoretic force formed by such an electric field may affect the light emitting device 150. That is, the light emitting device 150 inserted into the assembly hole 203 may be fixed to the upper surface of the first insulating layer 205 while maintaining a state of being inserted into the assembly hole 203 by the dielectrophoretic force formed between the first wire electrode 201 and the second wire electrode 202.

Although not shown, in a subsequent process, an insulating layer may be formed in the remaining space of the assembly hole 203 excluding the light emitting device 150, and then the first pad electrode (210 in FIG. 6) and the second pad electrode 220 may be formed. In addition, the first connection electrode 261 and the second connection electrode 262 may be formed. The first connection electrode 261 may connect a first electrode of the light emitting device 150 to the first pad electrode 210, and the second connection electrode 262 may connect a second electrode of the light emitting device 150 to the second pad electrode 220. Accordingly, when a voltage is applied to the first pad electrode (210 in FIG. 6) and the second pad electrode 220, the light emitting device 150 may emit light.

Meanwhile, in the display device according to the embodiment, a light emitting device may be used as a light source. The light-emitting device of the embodiment may be a self-emitting device that emits light by itself by application of an electric signal, and may be a semiconductor light-emitting device. The light emitting device of the embodiment may be made of an inorganic semiconductor material. Accordingly, the light emitting device of the embodiment is resistant to deterioration and has a semi-permanent lifespan, thereby providing stable light. Thus, the light emitting device of the embodiment can contribute to the display device realizing high-quality and high-definition images.

Figure 10:
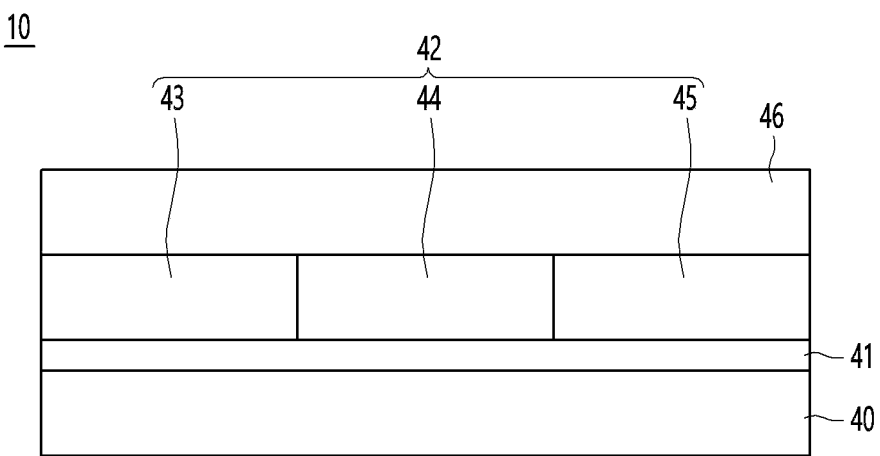
FIG. 10 is a schematic cross-sectional view of the display panel of FIG. 3.

FIG. 10 is a schematic cross-sectional view of the display panel of FIG. 3.

Referring to FIG. 10, the display panel 10 of the embodiment may comprise a first substrate 40, a light emitting unit 41, a color generating unit 42 and a second substrate 46. The display panel 10 of the embodiment may include more elements than these, but is not limited thereto. The first substrate 40 may be the substrate 200 shown in FIG. 8.

Although not shown, at least one or more insulating layers between the first substrate 40 and the light emitting unit 41, between the light emitting unit 41 and the color generating unit 42, and/or between the color generating unit 42 and the second substrate 46, but is not limited thereto.

The first substrate 40 may support the light emitting unit 41, the color generating unit 42, and the second substrate 46. The second substrate 46 may comprise various elements as described above. For example, the second substrate 46 may comprise the data lines (D1 to Dm, where m is an integer greater than or equal to 2), the scan lines S1 to Sn, the high potential voltage line VDDL and the low potential voltage line VSSL as shown in FIG. 3, the plurality of transistors and at least one capacitor as shown in FIG. 4, and the first pad electrode 210 and the second pad electrode 220 as shown in FIG. 5.

The first substrate 40 may be formed of glass, but is not limited thereto.

The light emitting unit 41 may provide light to the color generating unit 42. The light emitting unit 41 may include a plurality of light sources that emit light themselves by applying electricity. For example, the light source may include a light emitting device (300 in FIG. 6, 150 of FIG. 7).

As an example, the plurality of light emitting devices 300 are disposed separately for each sub-pixel of a pixel, and may independently emit light by controlling each sub-pixel.

As another example, the plurality of light emitting devices 300 may be arranged regardless of pixel division and simultaneously emit light from all sub-pixels.

The light emitting device 300 of the embodiment may emit blue light, but is not limited thereto. For example, the light emitting device 300 of the embodiment may emit white light or purple light.

The color generating unit 42 may generate of a different color light from the light provided by the light emitting unit 41.

For example, the color generating unit 42 may include a first color generator 43, a second color generator 44, and a third color generator 45. The first color generator 43 may correspond to the first sub-pixel PX1 of the pixel, the second color generator 44 may correspond to the second sub-pixel PX2 of the pixel, and the third color generator.

The first color generator 43 may generate first color light based on the light provided from the light emitting unit 41, and the second color generator 44 may generate second color light based on the light provided from the light emitting unit 41, and the third color generator 45 may generate third color light based on light provided from the light emitting unit 41. For example, the first color generator 43 may output blue light from the light emitting unit 41 as red light, and the second color generator 44 may output blue light from the light emitting unit 41 as green light, and the third color generator 45 may output blue light from the light emitting unit 41 as it is.

As an example, the first color generator 43 may include a first color filter, the second color generator 44 may include a second color filter, and the third color generator 45 may include a third color filter.

The first color filter, the second color filter, and the third color filter may be formed of a transparent material through which light can pass.

For example, at least one of the first color filter, the second color filter, and the third color filter may include a quantum dot.

The quantum dot of the embodiment may be selected from a group II-IV compound, a group IV-VI compound, a group IV element, a group IV compound, and a combination thereof.

The group II-VI compound may be selected the groups consisting of a binary compound selected from the group consisting of CdSe, CdTe, ZnS, ZnSe, ZnTe, ZnO, HgS, HgSe, HgTe, MgSe, MgS, and mixtures thereof a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof and quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V compound may be selected the groups consisting of a binary compound selected from the group consisting of GaN, GaP, GaAs, GaSb, AlN, AlP, AlAs, AlSb, InN, InP, InAs, InSb and mixtures thereof a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI compound may be selected the groups consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof.

The group IV element may be selected from the group consisting of S1, Ge, and mixtures thereof. The group IV compound may be a binary element compound selected from the group consisting of SiC, SiGe, and mixtures thereof.

Such quantum dot may have a full width of half maximum (FWHM) of an emission wavelength spectrum of approximately 45 nm or less, and light emitted through the quantum dot may be emitted in all directions. Accordingly, the viewing angle of the light emitting display device may be improved.

Meanwhile, the quantum dot may have a shape such as spherical, pyramidal, multi-arm, or cubic nanoparticles, nanotubes, nanowires, nanofibers, nanoplatelet particles, etc., but are not limited thereto.

For example, when the light emitting device 300 emits blue light, the first color filter may include red quantum dots, and the second color filter may include green quantum dots. The third color filter may not include quantum dots, but is not limited thereto. For example, blue light from the light emitting device 300 is absorbed by the first color filter, and the wavelength of the absorbed blue light is shifted by red quantum dots to output red light. For example, blue light from the light emitting device 300 is absorbed by the second color filter, and the wavelength of the absorbed blue light is shifted by green quantum dots to output green light. For example, blue light from the light emitting device 300 may be absorbed by the third color filter, and the absorbed blue light may be output as it is.

Meanwhile, when the light emitting device 300 emits white light, not only the first color filter and the second color filter, but also the third color filter may include quantum dots. That is, the wavelength of white light of the light emitting device 300 may be shifted to blue light by the quantum dots included in the third color filter.

For example, at least one of the first color filter, the second color filter, and the third color filter may include a phosphor. For example, some of the first color filter, the second color filter, and the third color filter may include quantum dots, and others may include phosphors. For example, each of the first color filter and the second color filter may include a phosphor and a quantum dot. For example, at least one of the first color filter, the second color filter, and the third color filter may include scattering particles. Since blue light incident on each of the first color filter, the second color filter, and the third color filter is scattered by the scattering particles and the color of the scattered blue light is shifted by the corresponding quantum dots, light output efficiency may be improved.

As another example, the first color generator 43 may include a first color converter and a first color filter. The second color generator 44 may include a second color converter and a second color filter. The third color generator 45 may include a third color converter and a third color filter. Each of the first color converter, the second color converter, and the third color converter may be disposed adjacent to the light emitting unit 41. The first color filter, the second color filter and the third color filter may be disposed adjacent to the second substrate 46.

For example, the first color filter may be disposed between the first color converter and the second substrate 46. For example, the second color filter may be disposed between the second color converter and the second substrate 46. For example, the third color filter may be disposed between the third color converter and the second substrate 46.

For example, the first color filter may contact the upper surface of the first color converter and have the same size as the first color converter, but is not limited thereto. For example, the second color filter may contact the upper surface of the second color converter and have the same size as the second color converter, but is not limited thereto. For example, the third color filter may contact the upper surface of the third color converter and have the same size as the third color converter, but is not limited thereto.

For example, the first color converter may include red quantum dots, and the second color converter may include green quantum dots. The third color converter may not include quantum dots. For example, the first color filter may include a red-based material that selectively transmits the red light converted in the first color converter, and the second color filter may include a green-based material that selectively transmits the green light converted in the second color converter, and the third color filter may include a blue-based material that selectively transmits blue light transmitted as it is through the third color converter.

Meanwhile, when the light emitting device 300 emits white light, the third color converter as well as the first color converter and the second color converter may also include quantum dots. That is, the wavelength of white light of the light emitting device 300 may be shifted to blue light by the quantum dots included in the third color filter.

Referring back to FIG. 10, the second substrate 46 may be disposed on the color generating unit 42 to protect the color generating unit 42. The second substrate 46 may be formed of glass, but is not limited thereto.

The second substrate 46 may be called a cover window, cover glass, or the like.

The second substrate 46 may be formed of glass, but is not limited thereto.

Meanwhile, the embodiment is to provide a self-assembling device capable of securing uniform luminance for each pixel.

The embodiment is to provide a self-assembling device capable of securing high luminance.

The embodiment is to provide a self-assembly apparatus capable of improving the self-assembly speed.

The embodiment is to provide a self-assembling device capable of easily collect light emitting devices.

The embodiment is to provide a self-assembling device capable of reducing an occupied area.

Hereinafter, various embodiments for achieving these problems to be solved are described.

The First Embodiment

Figure 11:
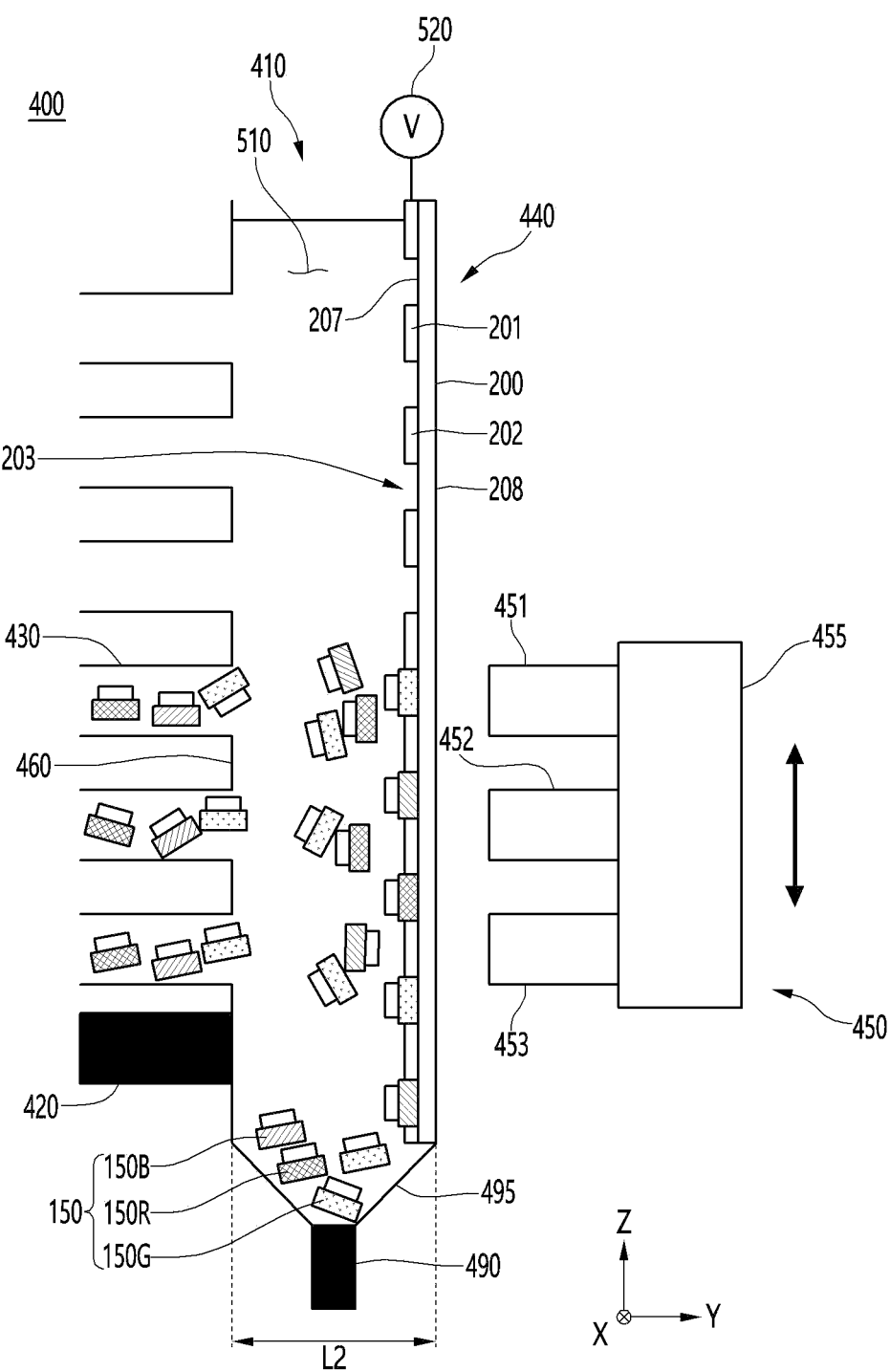
FIG. 11 is a side cross-sectional view showing the self-assembling device according to the first embodiment.
Figure 12:
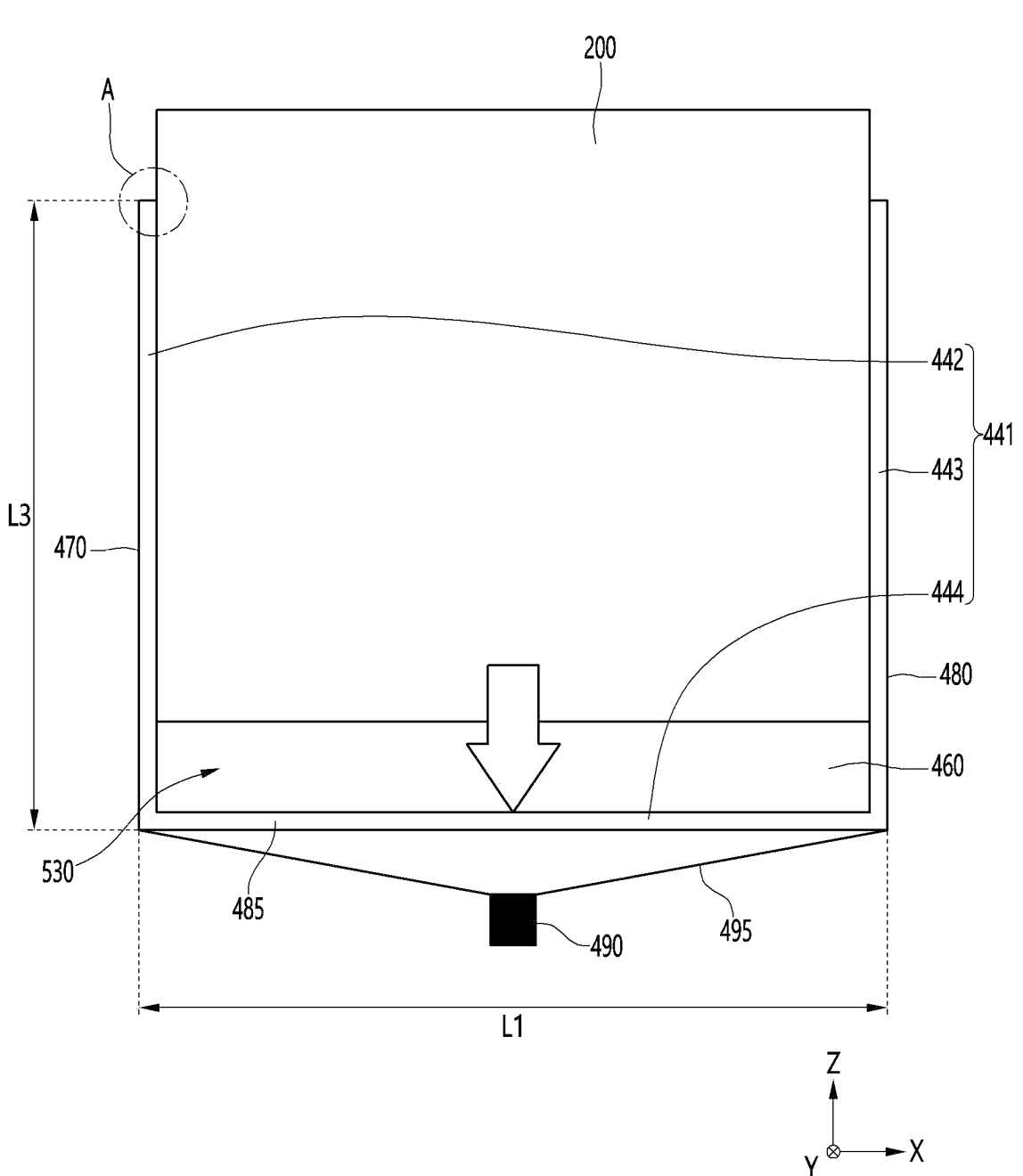
FIG. 12 is a front view showing the self-assembling device according to the first embodiment.
Figure 13:
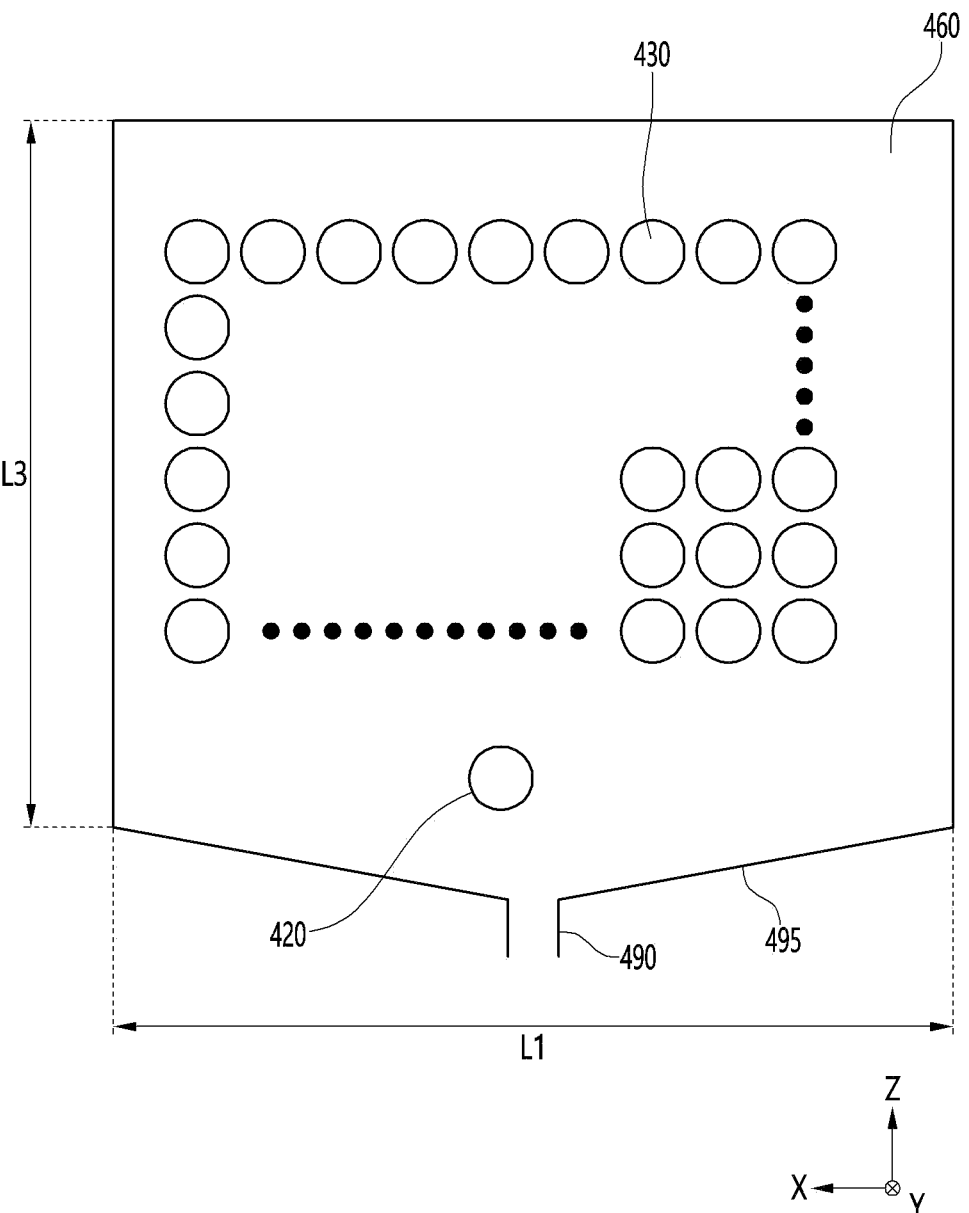
FIG. 13 is a rear view showing the self-assembling device according to the first embodiment.

FIG. 11 is a side cross-sectional view showing the self-assembling device according to the first embodiment. FIG. 12 is a front view showing the self-assembling device according to the first embodiment. FIG. 13 is a rear view showing the self-assembling device according to the first embodiment.

FIGS. 11 to 13, the self-assembling device 400 according to the first embodiment may comprise a chamber 410, a first supply part 420, a mounting part 440, and a magnet module 450.

The chamber 410 may be referred to as a container, container unit, water tank, vessel, or the like. The chamber 410 may be equipment in which a self-assembly process for the substrate 200 is performed. For example, chamber 410 may contain fluid 510. For example, the chamber 410 may accommodate the substrate 200.

In an embodiment, the self-assembly may mean aligning light emitting devices at a desired position on a substrate by using a dielectrophoretic force formed by an electric signal and a magnetic field formed by a magnet.

In the embodiment, the self-assembly apparatus may refer to a device that mounts the substrate 200 in the chamber 410, aligns the light emitting devices 150 to the substrate 200 by generating a magnetic field and applying an electric field, and then detaches the corresponding substrate 200.

For example, the chamber 410 has a first length L1 defined along a X-axis direction, a second length L2 defined along a Y-axis direction, and a third length L3 defined along a Z-axis direction. In this case, a first size defined by the product of the first length L1 and the third length L3 may be larger than a second size of the substrate 200. For example, the first length L1 may be greater than the length of the horizontal axis of the substrate 200. For example, the third length L3 may be equal to or greater than the length of the vertical axis of the substrate 200. Accordingly, the substrate 200 is accommodated in the chamber 410, and when the substrate 200 is accommodated in the chamber 410, the upper side of the substrate 200 may be positioned lower than the upper side of the chamber 410.

For example, when the substrate 200 is accommodated in the chamber 410, an upper surface of the fluid 510 accommodated in the chamber 410 may be positioned equal to or lower than the upper side of the substrate 200. Accordingly, the entire region of the substrate 200 may be immersed in the fluid 510 accommodated in the chamber 410.

The chamber 410 may comprise a first barrier rib 460, a second barrier rib 470 and a third barrier rib 480.

The first barrier rib 460 may be disposed on a second side of the chamber 410. The second barrier rib 470 may be disposed on a third side of the chamber 410. The third barrier rib 480 may be disposed on a fourth side of the chamber 410 and may face the second barrier rib 470.

The third side and the fourth side may face each other. For example, the first barrier rib 460 may be disposed parallel to a plane formed by the X axis and the Z axis. For example, each of the second barrier rib 470 and the third barrier rib 480 may be disposed parallel to a plane formed by the Y-axis and the Z-axis. The second barrier rib 470 and the third barrier rib 480 may be disposed parallel to each other.

For example, the second barrier rib 470 and the third barrier rib 480 may have the same size, but are not limited thereto. For example, each of the second barrier rib 470 and the third barrier rib 480 may be disposed perpendicular to the first barrier rib 460, but is not limited thereto. For example, the first barrier rib 460, the second barrier rib 470, and the third barrier rib 480 may be integrally formed with each other, but are not limited thereto.

The first barrier rib 460 may have a first length L1 along the X-axis direction, and each of the second barrier rib 470 and the third barrier rib 480 may have a second length L2 along the Y-axis direction. In this case, the second length L2 may be smaller than the first length L1. For example, the second length L2 may be three to ten times smaller than the first length L1.

According to the first embodiment, the substrate 200 may be disposed vertically and the second length L2 of the second barrier rib 470 may be significantly smaller than the first length L1 of the first barrier rib 460. Accordingly, the area occupied by the self-assembling device 400 according to the first embodiment can be significantly reduced such that more self-assembling devices can be provided in a unit area. Therefore, it is possible to mass-produce the self-assembled substrates 200 by simultaneously performing the self-assembly process for the plurality of substrates 200.

The first supply part 420 may supply the fluid 510 to the chamber 410. Although not shown, the first supply part 420 may comprise a supply line for supplying the fluid 510, a valve for blocking the supply of the fluid 510, or the like.

For example, as shown in FIG. 13, the first supply part 420 may be installed in a lower region of the first barrier rib 460 of the chamber 410. For example, the fluid 510 may be filled from the bottom of the chamber 410 to the top of the chamber 410 through the position of the first supply part 420. After the fluid 510 is filled up to the top of the chamber 410, the first supply part 420 is blocked by a valve (not shown). Thus, the fluid 510 in the chamber 410 does not flow back to the first supply part 420 and an amount of the fluid 510 can be constantly maintained in the chamber 410. For example, the fluid 510 may be water such as a deionized (DI) water, but is not limited thereto.

Although not shown, the first supply part 420 may include two or more supply parts. For example, the first supply part 420 may be installed near each corner region of the first barrier rib 460 of the chamber 410.

The mounting part 440 may be disposed on a first side of the chamber 410, and mount the assembly surface 207 of the substrate 200 so as not to be parallel to the horizontal plane of the chamber 410. The first side may face the aforementioned second side. A horizontal plane of the chamber 410 may be defined as a virtual plane parallel to the ground.

For example, as shown in FIG. 12, the mounting part 440 may vertically mount the assembly surface 207 of the substrate 200 with respect to the horizontal plane of the chamber 410. In this way, since the substrate 200 or the assembly surface 207 of the substrate 200 is mounted vertically with respect to the ground, even if the self-assembly process is performed, the substrate 200 is maintained perpendicular to the ground such that the warpage of the substrate 200 can be prevented.

According to the first embodiment, since the intensity of the magnetic field by the magnet module 450 applied to the entire region of the assembly surface 207 of the substrate 200 is constant, a uniform number of light emitting devices 150 may be aligned for each pixel of the substrate 200. Therefore, it is possible to secure uniform luminance for each pixel of the substrate 200.

In addition, according to the first embodiment, since a greater number of light emitting devices 150 are aligned on the substrate 200, high luminance can be secured.

In addition, according to the first embodiment, as many light emitting devices 150 as desired can be moved according to the movement of the magnet module 450, the self-assembly speed can be improved.

As shown in FIG. 12, the mounting part 440 may comprise a guide part 441 for guiding the substrate 200 from the upper side of the chamber 410 to the lower side.

The first side of the chamber 410 has an open area 530, and the guide part 441 may be installed around the open area 530.

The guide part 441 may comprise a first guide portion 442, a second guide portion 443 and a third guide portion 444.

For example, the first guide portion 442 may be installed on a first side of the open area 530. For example, the second guide portion 443 may be installed on a second side of the open area 530. For example, the first side and the second side may face each other. For example, the third guide portion 444 may be installed on a third side of the open area 530.

As shown in FIG. 12, the first side may be a left side of the open area 530, the second side may be a right side of the open area 530, and the third side may be a lower side of the open area 530. For example, the second barrier rib 470 may be disposed on the first side of the open area 530 and the third barrier rib 480 may be disposed on the second side of the open area 530. In this case, the first guide portion 442 is installed on the inner surface of the second barrier rib 470, the second guide portion 443 is installed on the inner surface of the third barrier rib 480, and the third guide portion 444 is installed on the inner surface of a bottom portion 485. Therefore, the substrate 200 is inserted into the first guide portion 442 and the second guide portion 443 of the mounting part 440 installed on the first and second sides of the open area 530, respectively, and is guided in a lower direction. After that, the substrate 200 may be inserted and fixed to the third guide portion 444.

For example, when the chamber 410 is filled with the fluid 510 after the substrate 200 is mounted on the mounting part 440, the fluid 510 may contact the inner surfaces of each of the first barrier rib 460, the second barrier rib 470, and the third barrier rib 480, the inner surface of a bottom portion 485, and the assembly surface 207 of the substrate 200.

Figure 14:
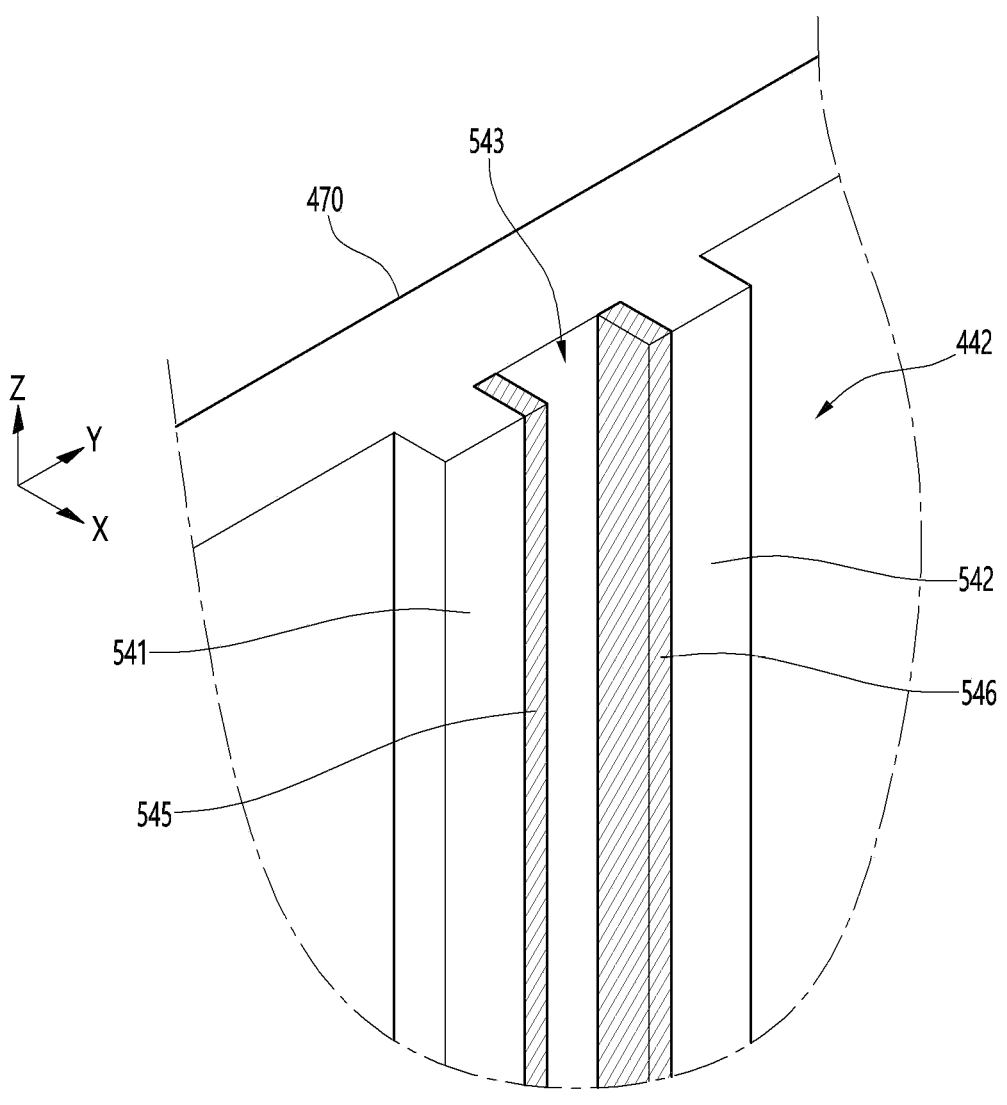
FIG. 14 is an enlarged perspective view illustrating area A of FIG. 12.

FIG. 14 is an enlarged perspective view illustrating area A of FIG. 12.

Although FIG. 14 illustrates the first guide portion 442 for convenience, the structure of each of the second guide portion 443 and the third guide portion 444 is also similar to that of the first guide portion 442. Accordingly, detailed descriptions of the second guide portion 443 and the third guide portion 444 can be easily understood from the following description of the first guide portion 442.

As shown in FIG. 14, the first guide portion 442 may comprise a first protruding portion 541 and a second protruding portion 542. An insertion groove 543 may be formed between the first protruding portion 541 and the second protruding portion 542. The substrate 200 may be inserted into the insertion groove 543.

For example, the first protruding portion 541 may protrude from the inner surface of the second barrier rib 470 toward the center region of the chamber 410 and extend from an upper side of the second barrier rib 470 to a lower side.

For example, the second protruding portion 542 may protrude from the inner surface of the second barrier rib 470 toward the center region of the chamber 410 and extend from the upper side of the second barrier rib 470 to the lower side. The second protruding portion 542 may have the same shape as the first protruding portion 541, but is not limited thereto. The second protruding portion 542 may be disposed parallel to the first protruding portion 541. The second protruding portion 542 may be spaced apart from the first protruding portion 541 along the Y-axis direction. A portion of the edge region of the substrate 200 may be inserted between the first protruding portion 541 and the second protruding portion 542. A separation distance between the first protruding portion 541 and the second protruding portion 542 may be greater than the thickness of the substrate 200 such that the substrate 200 may be inserted between the first protruding portion 541 and the second protruding portion 542.

Meanwhile, when the fluid 510 is filled in the chamber 410 after the substrate 200 is mounted on the mounting part 440, the fluid 510 should not leak out. To this end, as shown in FIG. 14, a first sealing part 545 and a second sealing part 546 are disposed on the inner surface of the first protruding portion 541 and the inner surface of the second protruding portion 542 facing each other, respectively.

Each of the first sealing part 545 and the second sealing part 546 may be attached to the inner surface of the first protruding portion 541 and the inner surface of the second protruding portion 542. For example, each of the first sealing part 545 and the second sealing part 546 may be made of a rubber material having elasticity, but is not limited thereto.

For example, a separation distance between the first sealing part 545 and the second sealing part 546 may be equal to or smaller than the thickness of the substrate 200. When the substrate 200 is inserted between the first sealing part 545 and the second sealing part 546, since the first sealing part 545 and the second sealing part 546 have elasticity and are pushed away from each other by the substrate 200, scratches may not occur on the substrate 200. On the other hand, as the first sealing part 545 and the second sealing part 546 are pushed away from each other, the original force becomes stronger such that each of the first sealing part 545 and the second sealing part 546 and the substrate 200 may adhere more strongly. Therefore, the fluid 510 in the chamber 410 may be sealed without leakage to the outside through the mounting part 440 on which the substrate 200 is mounted.

Although not shown, a sealing part may be attached to the inner surface of the second barrier rib 470 between the first protruding portion 541 and the second protruding portion 542.

When the substrate 200 is mounted on the mounting part 440, an upper side of the guide part 441 may be positioned equal to or higher than the upper side of the substrate 200. Therefore, since the fluid 510 filled in the chamber 410 comes in contact with the upper side of the substrate 200 without overflowing the outside of the chamber 410, the light emitting devices may be smoothly aligned on the upper side of the substrate 200 by the movement of the magnet module 450.

The magnet module 450 may be disposed on an opposite surface 208 opposite to the assembly surface 207 of the substrate 200.

For example, the magnet module 450 may be spaced apart from the opposite surface 208 of the substrate 200 and may move up, down, left and right. The magnet module 450 may not be in contact with the opposite surface 208 of the substrate 200. Therefore, vibration by the magnet module 450 is not transmitted to the substrate 200, and assembly characteristics of the substrate 200 can be improved. That is, when the magnet module 450 contacts the substrate 200, vibration may be induced in the substrate 200 by the magnet module 450. Due to the vibration of the substrate 200, the light emitting device 150 assembled on the substrate 200 may be detached such that assembly characteristics of the substrate 200 may deteriorate. However, in the embodiment, as shown in FIG. 11, the substrate 200 may be disposed vertically on the ground, and the magnet module 450 may be also spaced apart from the substrate 200 and may vertically move up, down, left and right with respect to the ground. Therefore, since the magnet module 450 moves apart in parallel with the substrate 200, vibration caused by the magnet module 450 is not transmitted to the substrate 200 such that assembly characteristics of the substrate 200 can be remarkably improved.

The magnet module 450 may comprise a body 455 and a plurality of magnets 451, 452, and 453. The body 455 may accommodate a plurality of magnets 451, 452, and 453. That is, the plurality of magnets 451, 452, and 453 may be fastened to the body 455. The plurality of magnets 451, 452, and 453 fastened to the body 455 may be spaced apart from each other at predetermined intervals, but are not limited thereto. For example, the magnets 451, 452, and 453 may have a long rod shape toward the substrate 200. For example, cross sections of the magnets 451, 452, and 453 may have a circular shape or a rectangular shape, but are not limited thereto.

For example, each of the plurality of magnets 451, 452, and 453 may be disposed to correspond to the plurality of second supply parts 430. For example, the number of the plurality of magnets 451, 452, and 453 may be the same as the number of the plurality of second supply parts 430, but is not limited thereto.

As an example, a region including the plurality of magnets 451, 452, and 453 may correspond to a partial region of the substrate 200. In this case, the magnet module 450 having the plurality of magnets 451, 452, and 453 rotates up and down, left and right, and the magnet module 450 is moved to the entire region of the substrate 200 such that the light emitting devices 150 may be assembled to the entire region of the substrate 200.

As another example, a region including the plurality of magnets 451, 452, and 453 may correspond to a region corresponding to one column of the substrate 200. That is, the plurality of magnets 451, 452, and 453 are arranged in a line along the X-axis direction, and the region including the plurality of magnets 451, 452, and 453 arranged in a line in this way may correspond to the width along the X-axial direction. In this case, the magnet module 450 having the plurality of magnets 451, 452, and 453 may be moved in one direction, for example, in the vertical direction such that the magnet module 450 may be moved to the entire region of the substrate 200. Thus, the light emitting devices 150 may be assembled to the entire region of the substrate 200.

As another example, the region including the plurality of magnets 451, 452, and 453 may correspond to the entire region of the substrate 200. In this case, the magnet module 450 having the plurality of magnets 451, 452, and 453 may rotate up, down, left, and right at a relatively short distance such that the magnet module 450 may be moved to the entire region of the substrate 200. Thus, the light emitting devices 150 may be assembled to the entire region of the substrate 200.

According to the first embodiment, since the substrate 200 is vertically disposed, the warpage of the substrate 200 can be prevented. In addition, the magnetic field may move parallel to the substrate 200 and the same magnetic field strength may be formed on the assembly surface 207 of the substrate 200. Accordingly, the number of light emitting devices 150 movable by the magnet module 450 may constantly be maintained. Accordingly, a uniform number of light emitting devices 150 can be aligned for each pixel of the substrate 200, and thus uniform luminance can be secured for each pixel of the substrate 200.

According to the first embodiment, the same magnetic field strength can be formed on the assembly surface 207 of the substrate 200. Accordingly, movement control of the light emitting devices 150 is easy such that more light emitting devices 150 can be aligned on the substrate 200, and high luminance light emission is possible.

According to the first embodiment, the same magnetic field strength may be formed on the assembly surface 207 of the substrate 200 by vertically disposing the substrate 200. Accordingly, as many light emitting devices 150 as desired can be quickly aligned in each pixel, the self-assembly speed can be improved.

Meanwhile, the self-assembling device according to the embodiment may comprise a plurality of second supply parts 430. Each of the plurality of second supply parts 430 may supply the light emitting devices 150 to the chamber 410. Although not shown, the second supply part 430 may comprise a supply line for supplying the light emitting devices 150 and a valve for blocking supply of the light emitting devices 150. In addition, although not shown, the second supply part 430 may comprise a nozzle that allows the light emitting devices 150 to be easily discharged and a vibrator that causes vibration such that the light emitting devices 150 are not clogged in the nozzle. The nozzle may be connected to the outlet end of the supply line. The vibrator may be mounted near the nozzle and may be mounted outside the supply line, for example, but is not limited thereto.

The light emitting devices 150 may comprise at least one of a red light emitting device 150R, a green light emitting device 150G, or a blue light emitting device 150B.

The plurality of second supply parts 430 may be installed in the first barrier rib 460. The plurality of second supply parts 430 may be regularly spaced apart from each other, but are not limited thereto.

As an example, the plurality of second supply parts 430 are installed in the entire region of the first barrier rib 460, and a region including the plurality of magnets 451, 452, and 453 provided in the magnet module 450 may correspond to the entire region of one barrier rib 460. In this case, even if the light emitting devices 150 are simultaneously supplied to the chamber 410 from each of the plurality of second supply parts 430, the plurality of light emitting devices 150 supplied to the chamber 410 do not move to another site by a magnetic field formed by the plurality of magnets 451, 452, and 453 provided in the magnet module 450, and may be maintained as supplied or aligned with the assembly hole 203 of the substrate 200. In this case, the light emitting device 150 aligned with the assembly hole 203 of the substrate 200 may be fixed to the assembly hole 203 without being detached from the assembly hole 203 by dielectrophoretic force. The assembly hole 203 may be referred to as a site. The dielectrophoretic force may be formed by a voltage applied from a voltage supply part 520 to the wiring electrodes 201 and 202 of the substrate 200.

As another example, the plurality of second supply parts 430 are installed in the entire region of the first barrier rib 460, and a region including the plurality of magnets 451, 452, and 453 provided in the magnet module 450 may correspond to a portion on one side of the first barrier rib 460. In this case, the light emitting devices 150 may be supplied to the chamber 410 from each of the second supply parts 430 corresponding to region including the plurality of magnets 451, 452, and 453 provided in the magnet module 450. If the magnet module 450 is, for example, moved upward, the light emitting devices 150 may be supplied to the chamber 410 from each of the second supply parts 430 corresponding to the region where the corresponding magnet module 450 is located. In this way, as the magnet module 450 moves, the light emitting devices 150 are sequentially supplied to the chamber 410 from each of the second supply parts 430 corresponding to the region corresponding to the changed position of the magnet module 450 such that the light emitting devices 150 can be aligned in the assembly hole 203 of the substrate 200.

As another example, the plurality of second supply parts 430 are installed in a partial region of the first barrier rib 460, and the region including the plurality of magnets 451, 452, and 453 provided in the magnet module 450 may correspond to a partial region of the first barrier rib 460. In this case, the plurality of light emitting devices 150 supplied to the chamber 410 from each of the plurality of second supply parts 430 do not move to another site by a magnetic field formed by the plurality of magnets 451, 452, and 453 provided in the magnet module 450, and may be maintained as supplied or aligned with the assembly hole 203 of the substrate 200. Thus, as the magnet module 450 rotates up, down, left and right, the corresponding light emitting devices 150 can be aligned in the assembly hole 203 of the entire region of the substrate 200.

The self-assembling device 400 according to the first embodiment may comprise a collection part 490.

The collection part 490 may be disposed on a lower side of the chamber 410. For example, the collection part 490 may be disposed below the bottom portion 485 of the chamber 410. The collection part 490 may collect the light emitting devices 150 collected in the lower side of the chamber 410 to recycle the light emitting devices 150.

Although not shown, the collection part 490 may comprise a collection line for collecting the light emitting devices 150 and a valve for blocking the collection of the light emitting devices 150.

The self-assembly apparatus 400 according to the first embodiment may comprise a collection induction part 495.

The collection induction part 495 may be disposed between the lower side of the chamber 410 and the collection part 490. For example, the collection induction part 495 may be disposed between the bottom portion 485 of the chamber 410 and the collection part 490. For example, the collection induction part 495 may be integrally formed with the bottom portion 485 of the chamber 410, but is not limited thereto.

The collection induction part 495 may induce the light emitting devices 150 to be collected in the collection part 490. To this end, the collection induction part 495 may have a shape in which a width decreases from an upper side thereof to a lower side.

For example, when the collection part 490 is installed at the center region of the chamber 410 at the lower side of the chamber 410, the collection induction part 495 may have the widest width at the upper side thereof, and the width may gradually increase from the upper side to the lower side. After decreasing, it may have the narrowest width at the lower side. For example, the lower side of the collection induction part 495 may be connected to the collection part 490. For example, the width of the upper side of the collection induction part 495 may be the same as the width of the bottom portion 485 of the chamber 410, but is not limited thereto. For example, the width of the lower side of the collection induction part 495 may be the same as that of the collection part 490, but is not limited thereto.

The light emitting devices 150 that are not assembled on the substrate 200 may freely fall downward due to gravity. The light emitting devices 150 that fall freely in this way may be collected into the collection part 490 by the collection induction part 495, and the corresponding light emitting devices 150 may be collected by the collection part 490.

According to the first embodiment, the light emitting devices 150 that are not assembled on the substrate 200 are collected by the collection induction part 495 into the collection part 490, and the collected light emitting devices are collected by the collection part 490. Thus, since the collection of the light emitting device 150 is easy, the collection rate can be increased.

[The Self-Assembly Process]

FIGS. 15 to 21 show self-assembly processes in the self-assembly apparatus according to the first embodiment.

Figure 15:
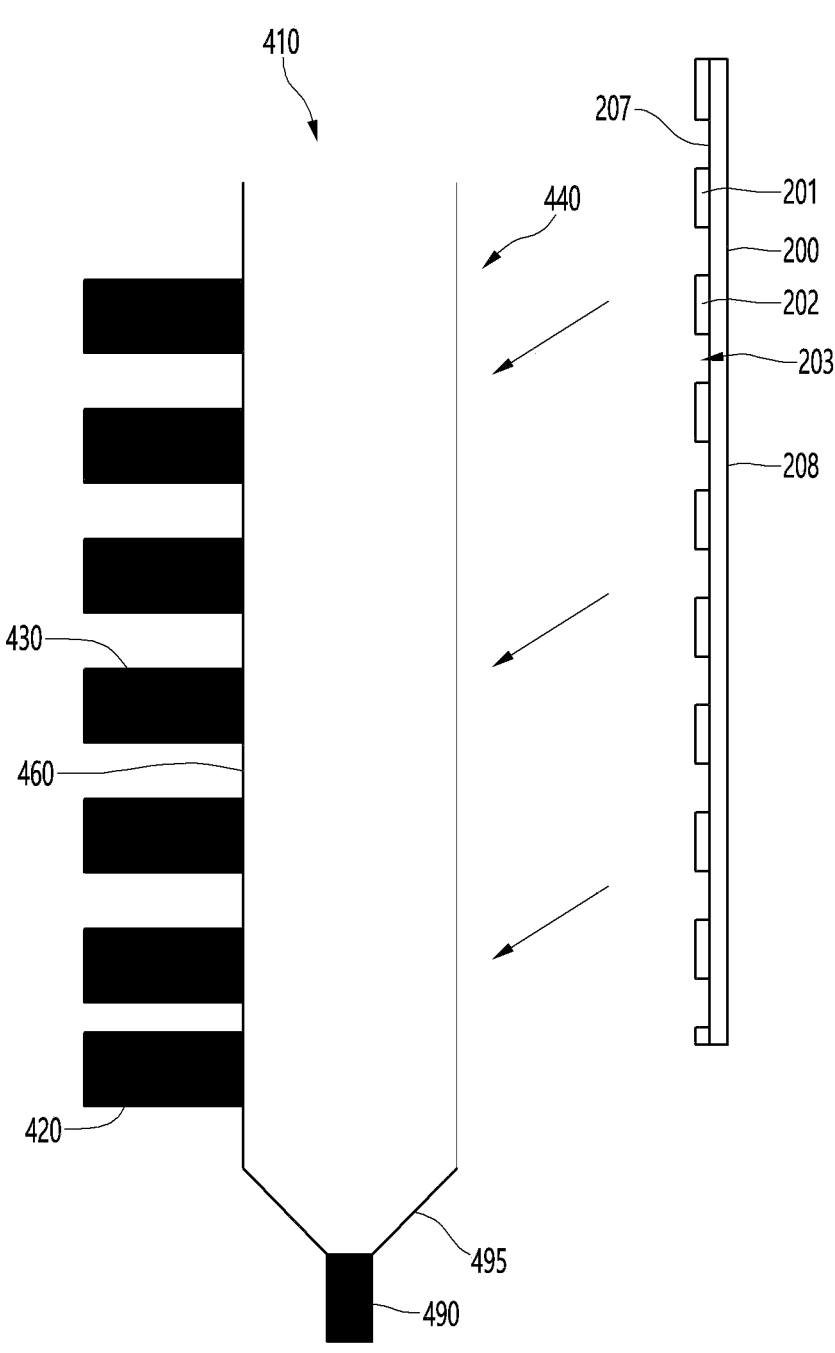
FIGS. 15 to 21 show self-assembly processes in the self-assembly apparatus according to the first embodiment.

As shown in FIG. 15, the substrate 200 may be mounted on the mounting part 440 provided on the first side of the chamber 410. For example, the substrate 200 may be guided along a downward direction through a guide part (441 in FIG. 12) of the mounting part 440. For example, the substrate 200 mounted on the mounting part 440 may be disposed vertically on a horizontal plane of the chamber 410, that is, on the ground.

Figure 16:
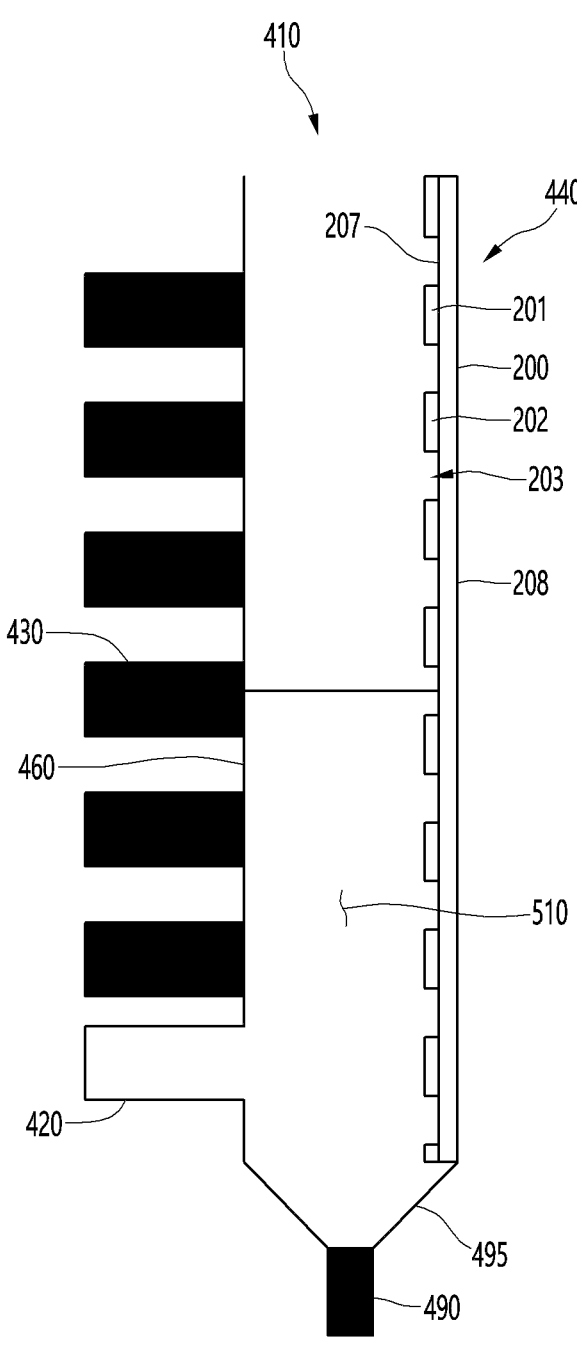

As shown in FIG. 16, the fluid 510 may be supplied to the chamber 410 by opening a valve (not shown) of the first supply part 420 to fill the chamber 410 with the fluid 510. For example, the surface of the fluid 510 filled in the chamber 410 may be equal to or smaller than the upper side of the substrate 200.

When the chamber 410 is filled with the fluid 510, the valve of the first supply part 420 may be closed. Thus, since the fluid 510 in the chamber 410 does not flow back to the first supply part 420, the fluid 510 may be constantly maintained in the chamber 410.

Figure 17:
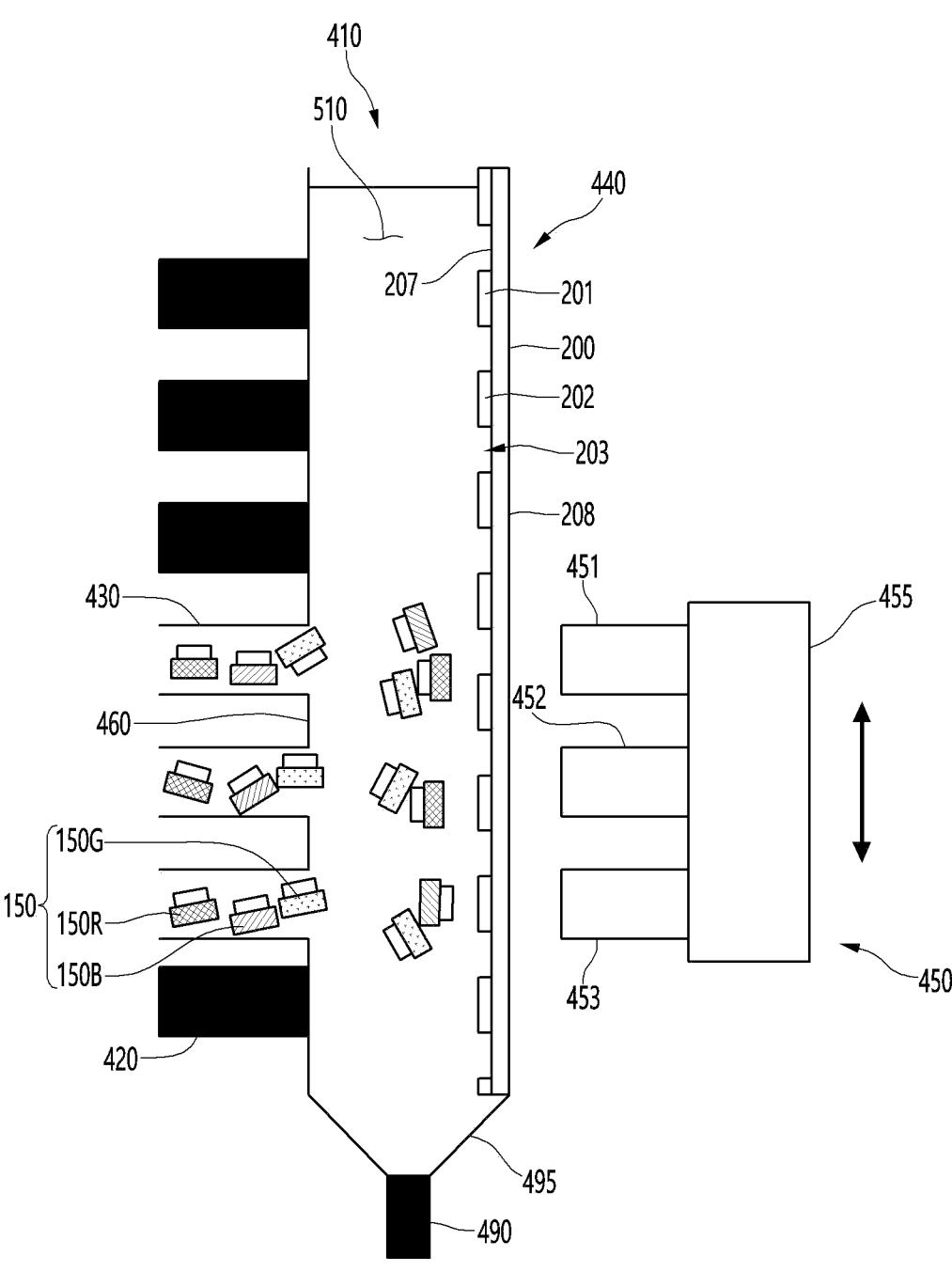

As shown in FIG. 17, the magnet module 450 may be disposed on an opposite surface 208 opposite to the assembly surface 207 of the substrate 200. Next, while the chamber 410 is filled with the fluid 510, a valve (not shown) of the second supply part 430 may be opened to supply the light emitting devices 150 into the fluid 510 in the chamber 410. The light emitting devices 150 supplied in this way may be fixed or positioned in the fluid 510 near the plurality of magnets 451, 452, and 453 by the magnetic field formed by the plurality of magnets 451, 452, and 453 provided in the magnet module 450.

Figure 18:
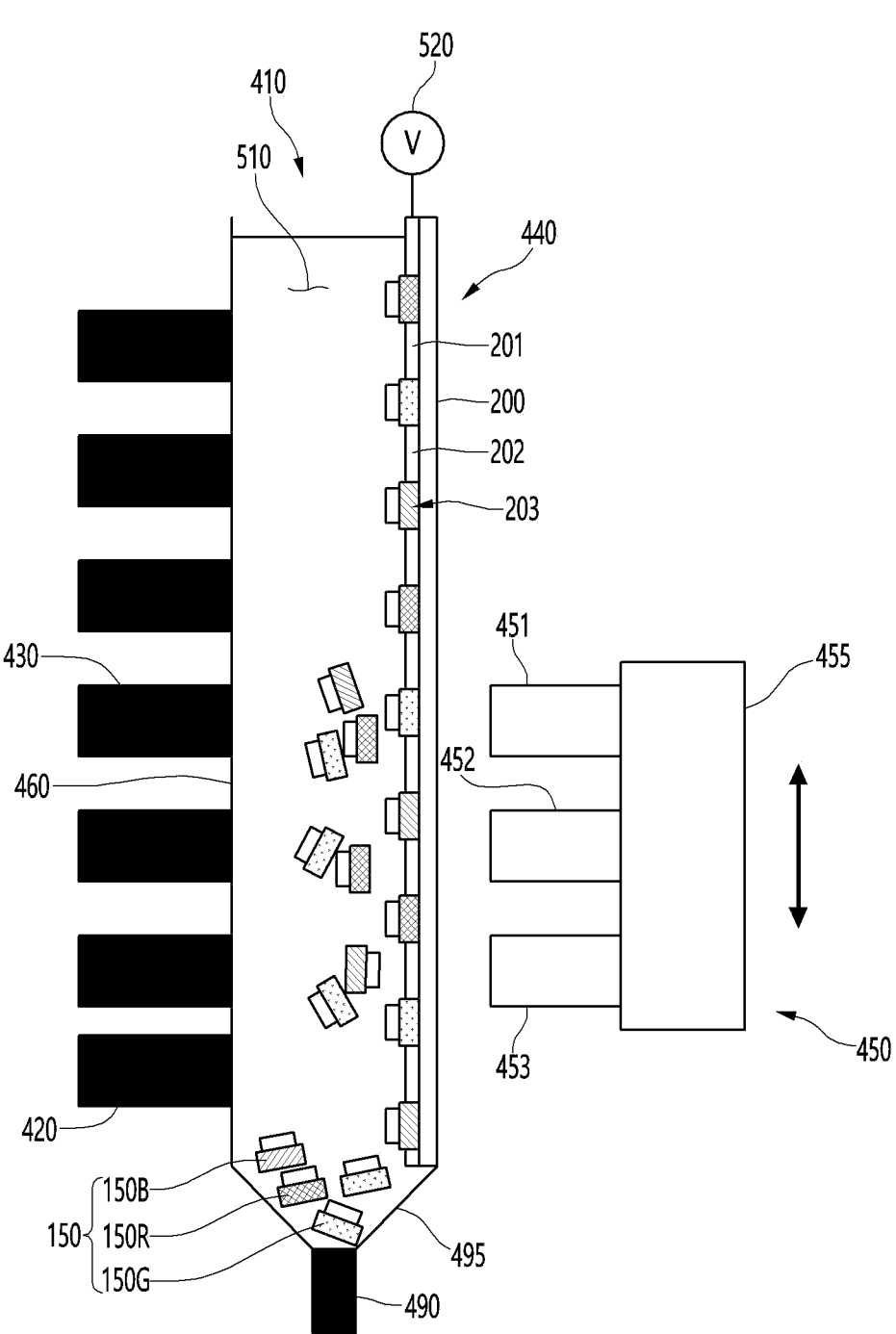

As shown in FIG. 18, the light emitting devices 150 may be influenced by a plurality of magnets 451, 452, and 453 provided in the magnet module 450. In this case, the light emitting devices 150 may be moved by the up, down, left, and right rotation of the magnet module 450 and aligned in the assembly hole 203 of the entire region of the substrate 200. In this case, the light emitting device 150 aligned with the assembly hole 203 of the substrate 200 may be fixed to the assembly hole 203 without being detached from the assembly hole 203 by dielectrophoretic force. The dielectrophoretic force may be formed by a voltage applied from the voltage supply part 520 to the wiring electrodes 201 and 202 of the substrate 200.

Meanwhile, during the self-assembly process of the substrate 200, the non-self-assembled light emitting devices 150 may escape from the influence of the magnetic field of the magnet module 450. Accordingly, these light emitting devices 150 may freely fall down by gravity and be collected in the collection part 490 by the collection induction part 495.

Figure 19:
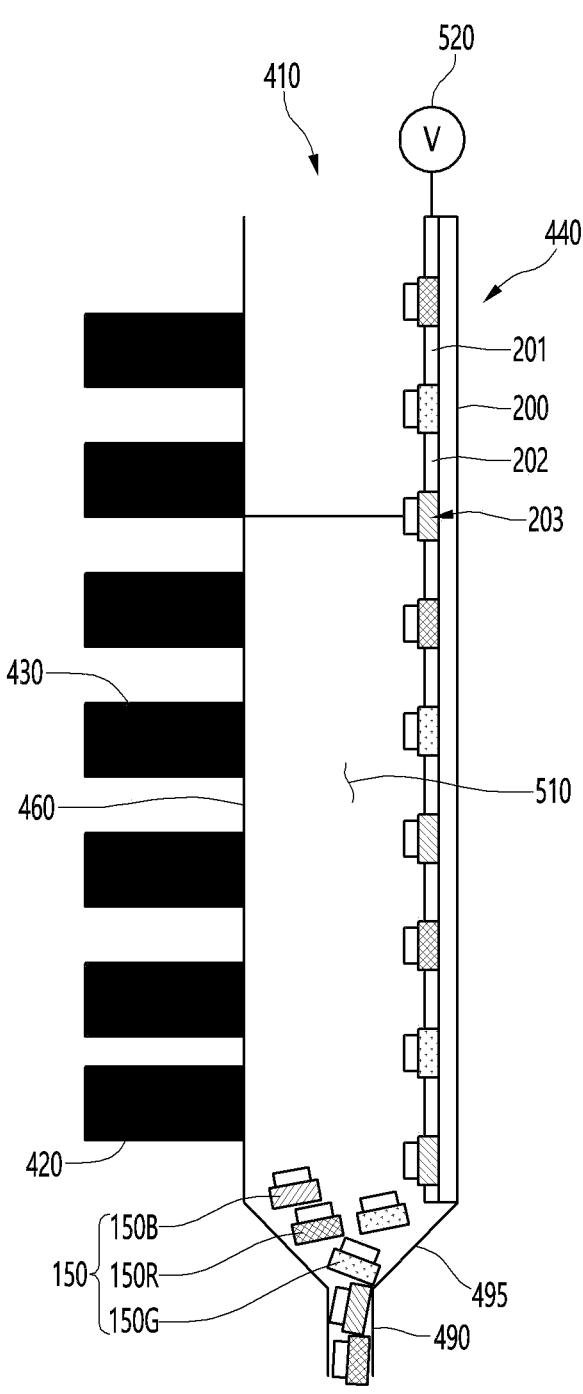

As shown in FIG. 19, since the valve (not shown) of the collection part 490 is opened, the fluid 510 and the light emitting devices 150 in the chamber 410 can be discharged to the outside through the collection part 490. Since the collection part 490 is installed in a lower side of the chamber 410, the fluid 510 in the chamber 410 can be naturally discharged to the outside through the collection part 490. Not only the fluid 510 but also the light emitting devices 150 may be collected through the collection part 490.

As another example, while the fluid 510 of the chamber 410 is discharged to the outside through the first supply part 420, the light emitting devices 150 may be collected through the collection part 490.

While the fluid 510 in the chamber 410 is discharged, the voltage of the voltage supply part 520 is applied to the wiring electrodes 201 and 202 of the substrate 200 such that the light emitting device 150 is applied to the assembly hole 203 of the substrate 200.

Figure 20:
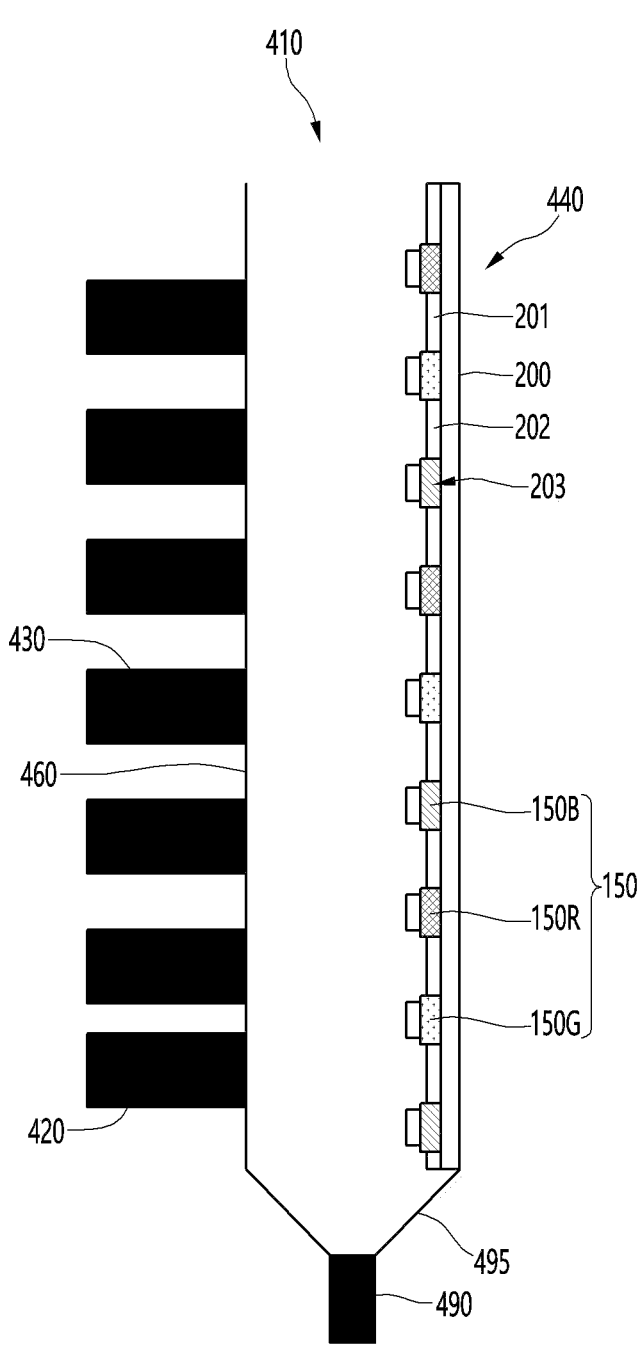

As shown in FIG. 20, the substrate 200 may be dried by performing a drying process. For example, the assembly surface 207 of the substrate 200 may be dried by a drying process. For example, the assembly hole 203 of the substrate 200 and the light emitting device 150 fixed to the assembly hole 203 may be dried by a drying process.

Subsequently, the light emitting devices 150 fixed to the assembly hole 203 of the substrate 200 may be temporarily fixed to the assembly hole 203 of the substrate 200 even without dielectrophoretic force. For example, a release paper may be covered on the assembly surface 207 of the substrate 200. The light emitting devices 150 fixed to the assembly hole 203 of the substrate 200 may be temporarily fixed by the release paper.

If the temporary fixing is not performed, the light emitting devices 150 may be fixed to the assembly holes 203 of the substrate 200 by dielectrophoretic force by the voltage of the voltage supply part 520 applied to the wiring electrodes 201 and 202.

Figure 21:
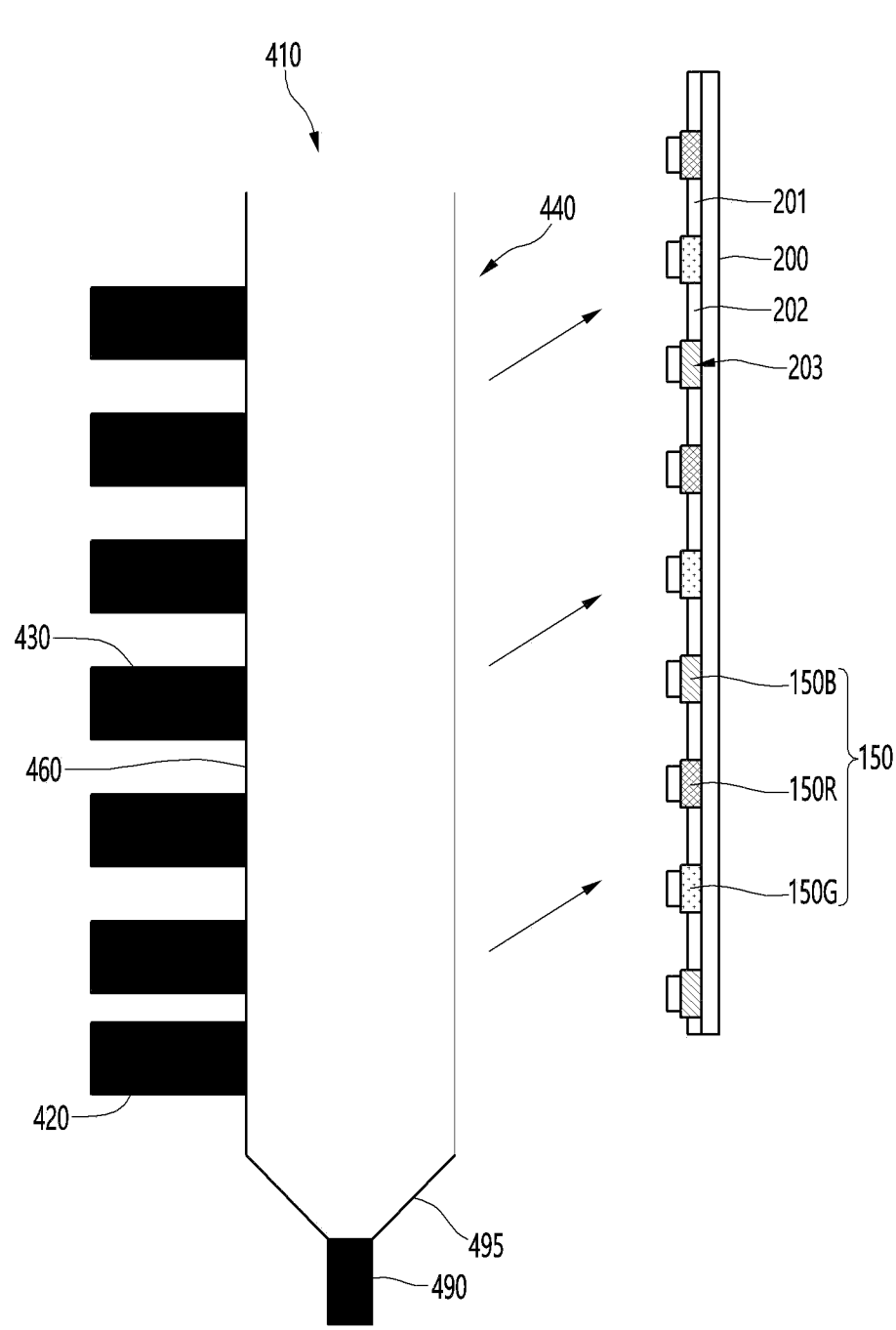

As shown in FIG. 21, the substrate 200 may be detached from the mounting part 440. For example, the substrate 200 inserted into the guide part 441 of the mounting part 440 may be guided upward along the guide part 441 to be detached from the chamber 410.

The substrate 200 detached from the chamber 410 may be manufactured as a display device through a post-process. For example, the light emitting devices 150 aligned in the assembly hole 203 of the substrate 200 may be connected to electrodes to emit light. Therefore, red light, green light, and blue light are emitted by the plurality of light emitting devices 150 provided for each pixel such that desired colors can be realized.

The Second Embodiment

Figure 22:
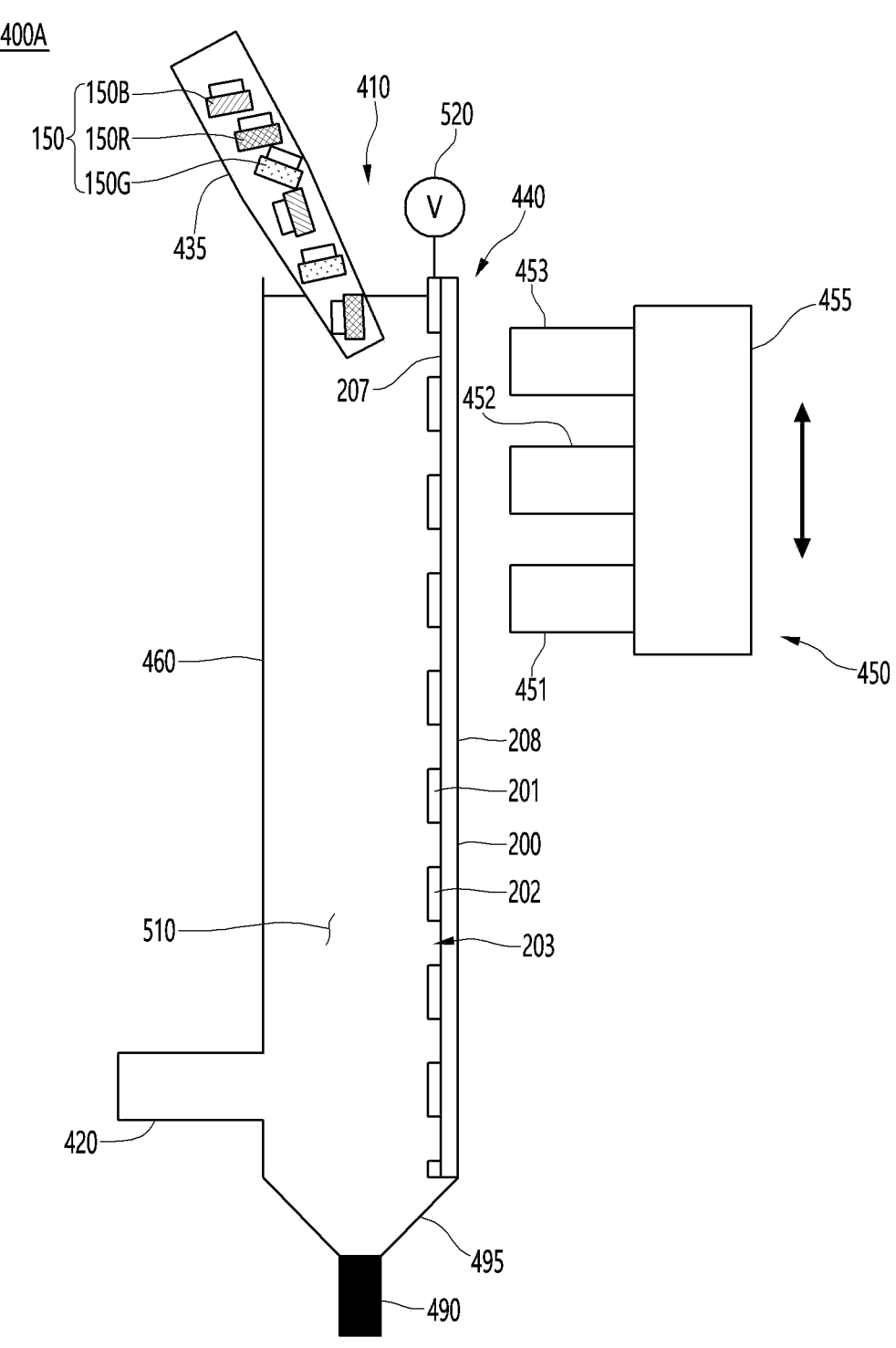
FIG. 22 is a side cross-sectional view showing a self-assembling device according to the second embodiment.

FIG. 22 is a side cross-sectional view showing a self-assembling device according to the second embodiment.

The second embodiment is similar to the first embodiment except that light emitting devices 150 are supplied from an upper side of the chamber 410. In the second embodiment, the same reference numerals are assigned to elements having the same functions, shapes and/or structures as those in the first embodiment, and detailed descriptions are omitted.

Referring to FIG. 22, the self-assembling device 400A according to the second embodiment may comprise a chamber 410, a first supply part 420, a second supply part 435, a mounting part 440, and a magnet module 450.

Since the chamber 410, the first supply part 420, the mounting part 440, and the magnet module 450 have been described in the first embodiment, detailed descriptions will be omitted.

The second supply part 435 may be positioned of the upper side of the chamber 410 to supply the light emitting devices 150 to the chamber 410.

For example, the second supply part 435 may comprise a pipette or dropper, but is not limited thereto.

For example, the upper side of the chamber 410 may be open. Before the light emitting devices 150 are supplied to the chamber 410, the chamber 410 may be filled with the fluid 510.

A plurality of light emitting devices 150 may be filled in the second supply part 435, that is, the dropper. For example, the plurality of light emitting devices 150 may be filled with liquid in the dropper. For example, the liquid may be water such as DI water, but is not limited thereto. Although one dropper is shown in the drawing, a plurality of droppers may be provided.

As another example, although not shown, the second supply part 435 may comprise a supply line and a nozzle located at an end of the supply line.

The light emitting devices 150 supplied by each of the plurality of droppers may freely fall downward due to gravity. As such, the freely falling light emitting devices 150 will be stopped by the magnetic field formed by the plurality of magnets 451, 452, and 453 of the magnet module 450 in a region of the chamber 410 where the magnet module 450 is located. That is, the magnetic field formed by the plurality of magnets 451, 452, and 453 of the magnet module 450 may affect the chamber 410, and the light emitting devices 150 that have fallen freely into the sphere of influence of the magnetic field may be stopped in the region of the chamber 410 where the corresponding magnet module 450 is located.

The light emitting devices 150 may be supplied to the chamber 410 from the upper side of the chamber 410 by a plurality of droppers, and the light emitting devices 150 supplied in this way may be fixed by the plurality of magnets 451, 452, 453. As the magnet module 450 rotates vertically and horizontally, the light emitting devices 150 also may rotate vertically and horizontally. Thus, the light emitting devices 150 can move to the entire region of the substrate 200 and move through the assembly holes 203 of the substrate 200.

According to the second embodiment, the light emitting devices 150 may be supplied to the chamber 410 from the upper side of the chamber 410 and freely fall by gravity. Thus, the magnet module 450 may be fixed to a specific area. Accordingly, the light emitting devices 150 can be easily supplied to the chamber 410 and can be easily fixed to the magnet module 450 such that the self-assembly process can be efficiently performed, thereby reducing the process time and reducing the process cost.

The Third Embodiment

Figure 23:
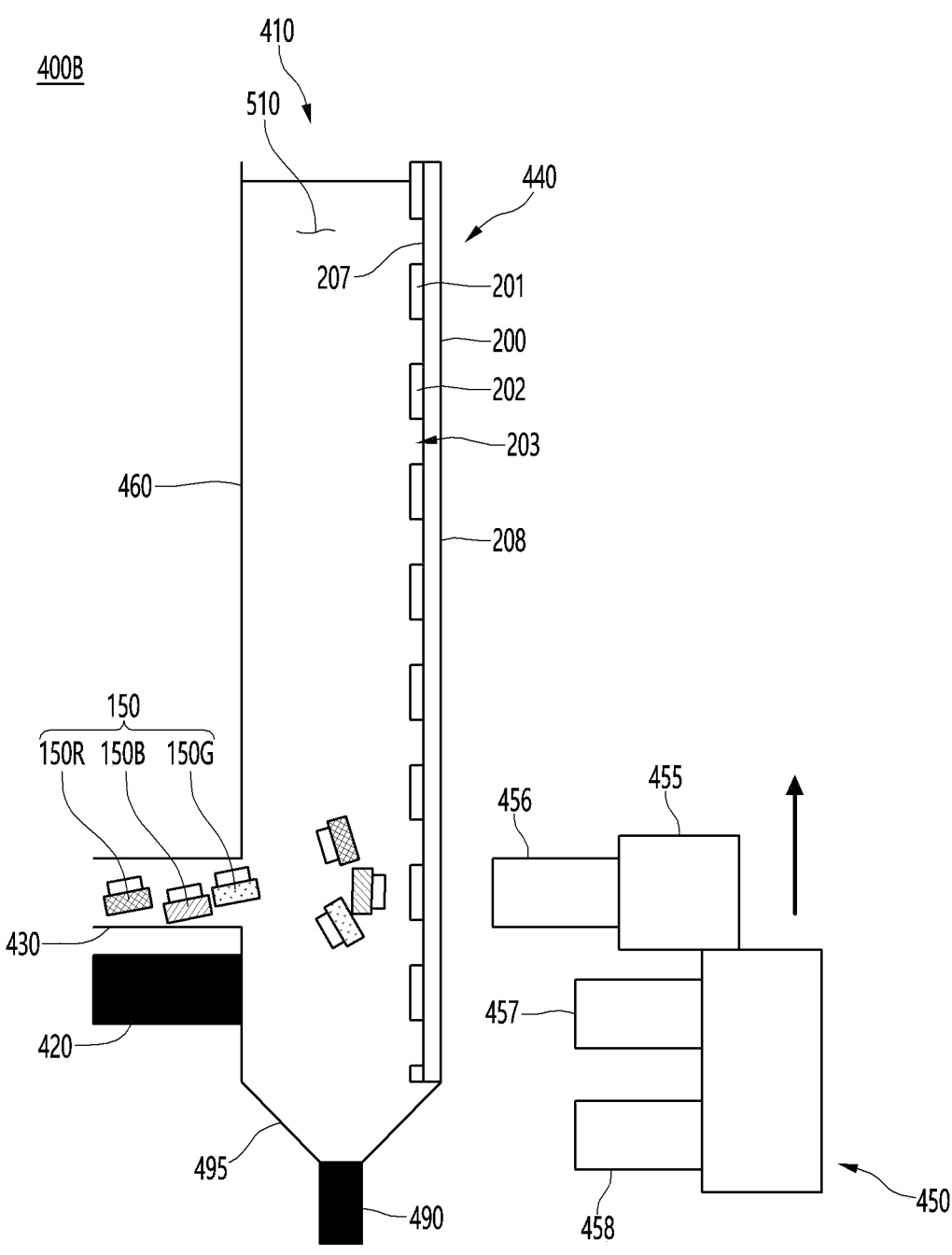
FIG. 23 is a side cross-sectional view showing a self-assembling device according to the third embodiment.

FIG. 23 is a side cross-sectional view showing a self-assembling device according to the third embodiment.

The third embodiment is similar to the first embodiment except that the first supply section 420 has one column and the magnets are arranged in a plurality of magnet columns 456, 457 and 458. In the third embodiment, the same reference numerals are given to elements having the same functions, shapes and/or structures as those in the first embodiment, and detailed descriptions will be omitted.

Referring to FIG. 23, the self-assembling device 400B according to the third embodiment may comprise a chamber 410, a first supply part 420, a second supply part 430, a mounting part 440, and a magnet module 450.

Since the chamber 410, the first supply part 420, and the mounting part 440 have been described in the first embodiment, detailed descriptions will be omitted.

The second supply part 430 may have one column arranged in a line along the X-axis direction, for example. A plurality of second supply parts 430 included in one column may simultaneously supply the light emitting devices 150 to the chamber 410.

The magnet module 450 may comprise a plurality of magnet columns 456, 457 and 458. That is, in each of the plurality of magnet columns 456, 457 and 458, a plurality of magnets may be arranged in a line along, for example, the X-axis direction. For example, each of the plurality of magnet columns 456, 457 and 458 may be individually movable in a horizontal direction. For example, the plurality of magnet columns 456, 457 and 458 may simultaneously be movable in a vertical direction.

For example, after the first magnet column 456 of the magnet module 450 is located in a region corresponding to the second supply part, the light emitting devices 150 may be supplied to the chamber 410 from the second supply part 430. The light emitting devices 150 supplied to the chamber 410 may be fixed by a plurality of magnets included in the first magnet column 456 of the magnet module 450.

For example, after the magnet module 450 is moved upward in units of one column such that the second magnet column 457 of the magnet module 450 is located in a region corresponding to the second supply part 430, the light emitting devices 150 may be supplied to the chamber 410 from the second supply part 430. The light emitting devices

150 supplied to the chamber 410 may be fixed by a plurality of magnets included in the second magnet column 457 of the magnet module 450.

For example, after the magnet module 450 is moved upward in units of one column such that the third magnet column 458 of the magnet module 450 is located in a region corresponding to the second supply part 430, the light emitting devices 150 may be supplied to the chamber 410 from the second supply part 430. The light emitting devices 150 supplied to the chamber 410 may be fixed by a plurality of magnets included in the third magnet column 458 of the magnet module 450.

In this way, while each of the first to third magnet columns 456, 457 and 458 of the magnet module 450 moves upward in units of one column, the light emitting device 150 supplied from the second supply part 430 may be fixed. Accordingly, a quantity of light emitting devices 150 may be fixed to the first to third magnet columns 456, 457 and 458 of the magnet module 450 through the second supply part 430. That is, the number of light emitting devices 150 fixed to each of the first to third magnet columns 456, 457 and 458 of the magnet module 450 can be the same. In this way, as the magnet module 450 in which a quantity of light emitting devices 150 is fixed to each of the first to third magnet columns 456, 457 and 458 rotate up and down, left and right, the light emitting devices 150 may be uniformly assembled on the entire region of the substrate 200. Accordingly, uniform luminance can be obtained for each pixel, and since more light emitting devices 150 are aligned for each pixel, high luminance can be implemented.

The Fourth Embodiment

Figure 24:
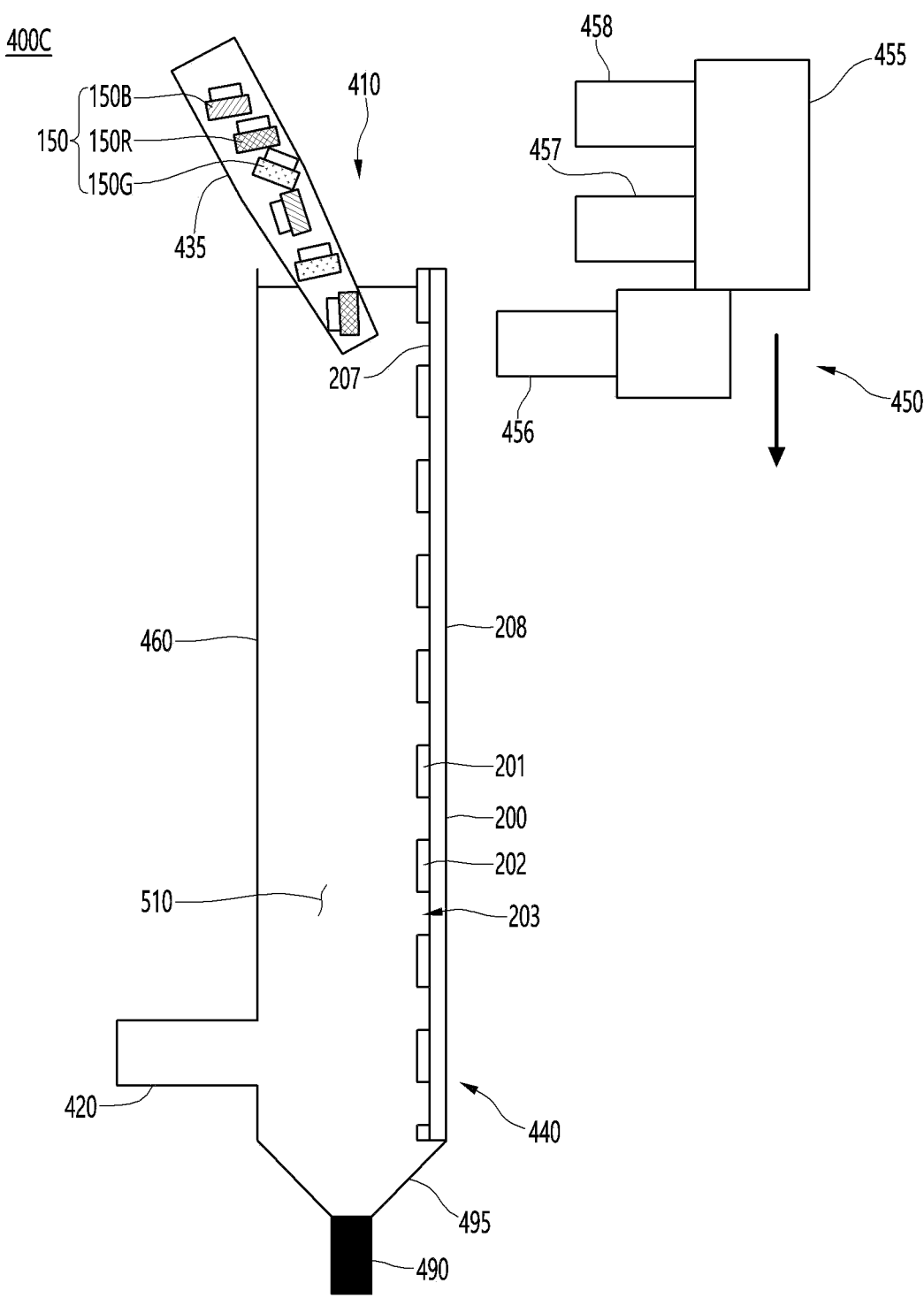
FIG. 24 is a side cross-sectional view showing a self-assembling device according to the fourth embodiment.

FIG. 24 is a side cross-sectional view showing a self-assembling device according to the fourth embodiment.

The fourth embodiment is similar to the second embodiment except that the magnets are arranged in a plurality of magnet columns 456, 457 and 458. In the fourth embodiment, the same reference numerals are given to elements having the same functions, shapes and/or structures as those in the second embodiment, and detailed descriptions will be omitted.

Referring to FIG. 24, the self-assembly apparatus 400C according to the fourth embodiment may comprise a chamber 410, a first supply part 420, a second supply part 435, a mounting part 440, and a magnet module 450.

Since the chamber 410, the first supply part 420, the second supply part 435, and the mounting part 440 have been described in the second embodiment, detailed descriptions will be omitted.

The magnet module 450 may comprise a plurality of magnet columns 456, 457 and 458. That is, in each of the plurality of magnet columns 456, 457 and 458, a plurality of magnets may be arranged in a line along, for example, the X-axis direction. For example, each of the plurality of magnet columns 456, 457 and 458 may be individually movable in a horizontal direction. For example, the plurality of magnet columns 456, 457 and 458 may be movable in a vertical direction at the same time.

For example, after the first magnet column 456 of the magnet module 450 is located in a region corresponding to the upper side of the chamber 410, the light emitting devices 150 may be supplied to the chamber 410 from the second supply part 435 located in the upper side of the chamber 410. The light emitting devices 150 supplied to the chamber 410 may be fixed by a plurality of magnets included in the first magnet column 456 of the magnet module 450.

For example, after the magnet module 450 is moved downward in units of one column such that the second magnet column 457 of the magnet module 450 is located in a region corresponding to the upper side of the chamber 410, the light emitting devices 150 may be supplied to the chamber 410 from the second supply part 435. The light emitting devices 150 supplied to the chamber 410 may be fixed by a plurality of magnets included in the second magnet column 457 of the magnet module 450. The first magnet column 456 may be positioned lower than the second magnet column 457.

For example, after the magnet module 450 is moved downward in units of one column such that the third magnet column 458 of the magnet module 450 is located in a region corresponding to the upper side of the chamber 410, the light emitting devices 150 may be supplied to the chamber 410 from the second supply part 435. The light emitting devices 150 supplied to the chamber 410 may be fixed by a plurality of magnets included in the second magnet column 458 of the magnet module 450. The second magnet column 457 may be positioned lower than the third magnet column 458.

In this way, while each of the first to third magnet columns 456, 457 and 458 of the magnet module 450 moves downward in units of one column, the light emitting device 150 supplied from the second supply part 430 located in the upper side of the chamber 410 may be fixed. Accordingly, a quantity of light emitting devices 150 may be fixed to the first to third magnet columns 456, 457 and 458 of the magnet module 450 through the second supply part 430. That is, the number of light emitting devices 150 fixed to each of the first to third magnet columns 456, 457 and 458 of the magnet module 450 can be the same. In this way, as the magnet module 450 in which a quantity of light emitting devices 150 is fixed to each of the first to third magnet columns 456, 457 and 458 rotate up and down, left and right, the light emitting devices 150 may be uniformly assembled on the entire region of the substrate 200. Accordingly, uniform luminance can be obtained for each pixel, and since more light emitting devices 150 are aligned for each pixel, high luminance can be implemented.

The Fifth Embodiment

Figure 25:
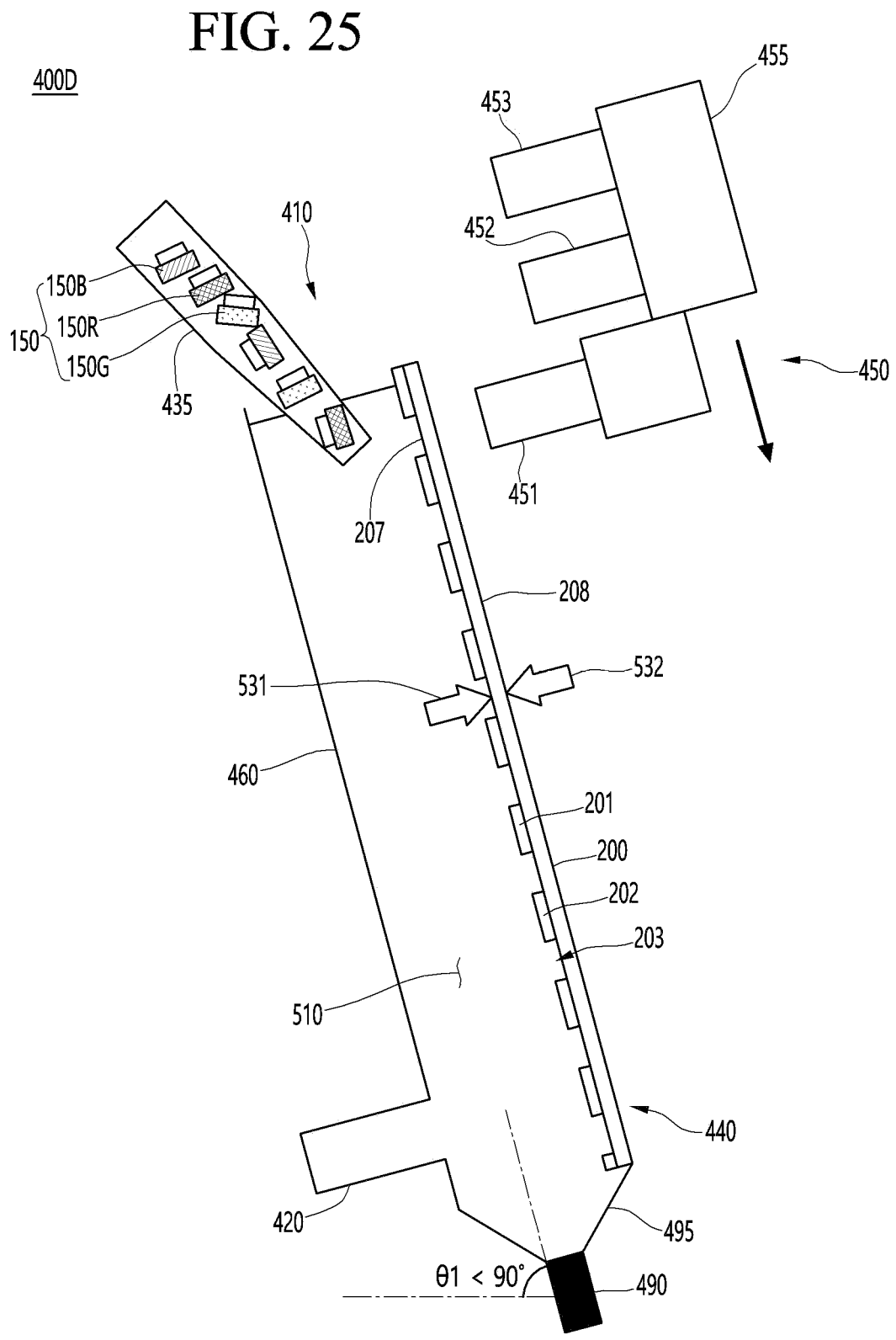
FIG. 25 is a side cross-sectional view showing a self-assembling device according to the fifth embodiment.

FIG. 25 is a side cross-sectional view showing a self-assembling device according to the fifth embodiment.

The fifth embodiment is similar to the second embodiment except that the mounting part 440 arranges the substrate 200 to be inclined in the first direction. In the fifth embodiment, the same reference numerals are assigned to elements having the same functions, shapes and/or structures as those in the second embodiment, and detailed descriptions will be omitted.

Referring to FIG. 25, the self-assembly apparatus 400D according to the fifth embodiment may comprise a chamber 410, a first supply part 420, a second supply part 435, a mounting part 440, and a magnet module 450.

Since the chamber 410, the first supply part 420, the second supply part 435, and the mounting part 440 have been described in the second embodiment, detailed descriptions will be omitted.

For example, the mounting part 440 may mount the substrate 200 at an acute angle with respect to a horizontal plane of the chamber 410, that is, the ground. An angle θ1 between the ground and the substrate 200 may be less than 90 degrees.

To this end, the first and second guide portions (442 and 443 of FIG. 12) of the mounting part 440 may be provided in the chamber 410 to be inclined at an acute angle with respect to the ground. Therefore, the substrate 200 is inserted into the first and second guide portions (442 and 443 in FIG. 12) and guided along the inclined direction along the first and second guide portions (442 and 443 in FIG. 12) such that it can be fixed to the third guide portion (444 in FIG. 12).

When the substrate 200 is mounted on the mounting part 440, the assembly surface 207 of the substrate 200 may face the ground.

When the substrate 200 is disposed to be inclined at an acute angle with respect to the ground, the substrate 200 may be bent toward the ground as shown in the direction of the arrow 532. Since the chamber 410 is filled with the fluid 510, even when the substrate 200 is disposed at an acute angle with respect to the ground, the substrate 200 is supported by the fluid 510 as shown in the direction of the arrow 531 such that the warpage of the substrate 200 does not occur. Therefore, since the same magnetic field intensity is formed on the assembly surface 207 in the entire region of the substrate 200, uniform luminance can be secured for each pixel, high luminance can be obtained, and self-assembly speed can be improved.

In addition, when the substrate 200 is disposed to be inclined at an acute angle with respect to the ground, even if a foreign substance that is not affected by the magnetic field falls due to gravity, it may not come into contact with the assembly surface 207 of the substrate 200. Accordingly, since contamination of the assembly surface 207 of the substrate 200 is prevented, a high-quality display device can be implemented.

Meanwhile, the fifth embodiment may be equally applied to the first embodiment and the third embodiment.

The Sixth Embodiment

Figure 26:
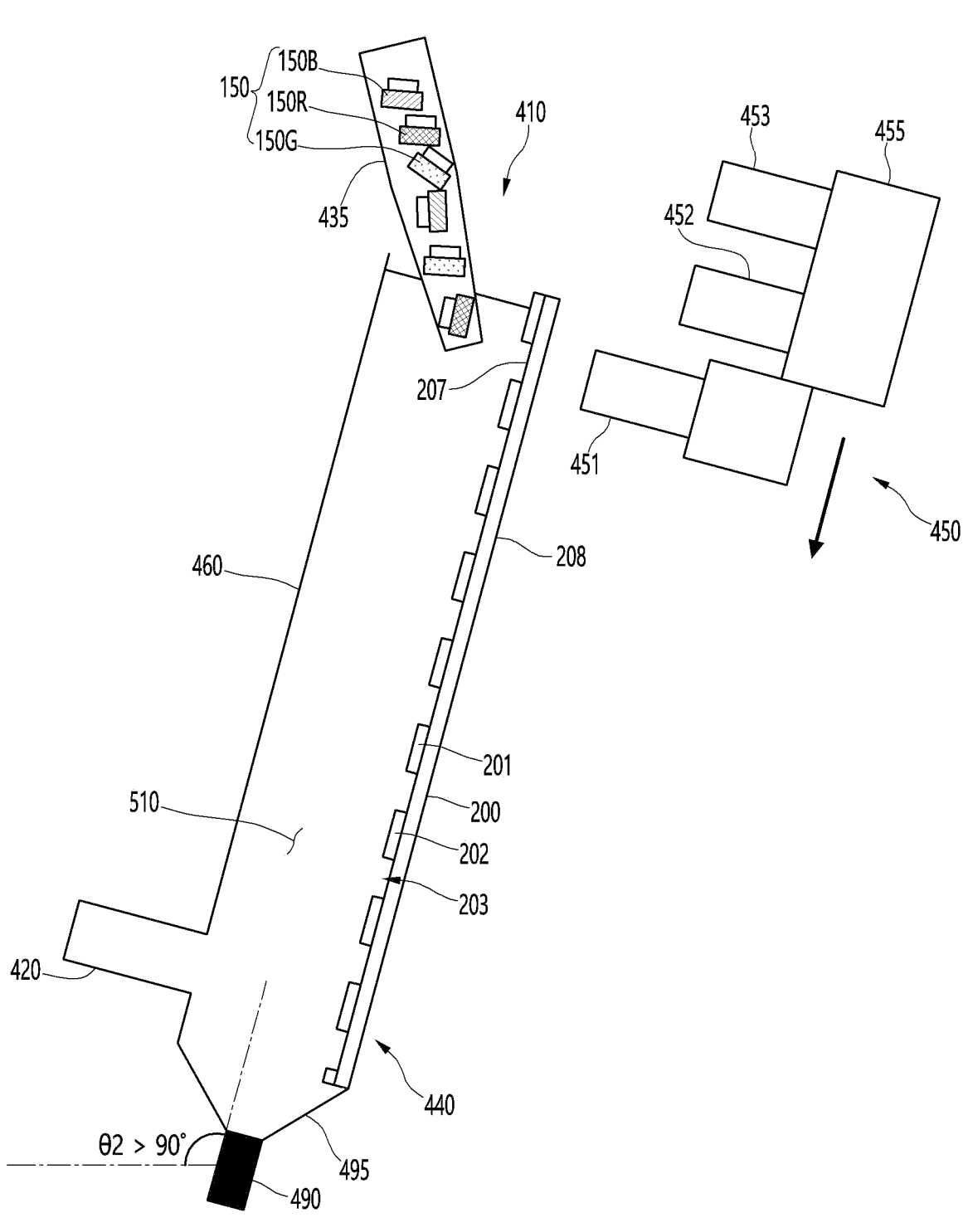
FIG. 26 is a side cross-sectional view showing a self-assembling device according to the sixth embodiment.

FIG. 26 is a side cross-sectional view showing a self-assembling device according to the sixth embodiment.

The sixth embodiment is similar to the second embodiment except that the mounting part 440 arranges the substrate 200 to be inclined in the second direction. In the sixth embodiment, elements having the same functions, shapes and/or structures as those in the second embodiment are assigned the same reference numerals and detailed descriptions will be omitted.

Referring to FIG. 26, the self-assembling device 400E according to the sixth embodiment may comprise a chamber 410, a first supply part 420, a second supply part 435, a mounting part 440, and a magnet module 450.

Since the chamber 410, the first supply part 420, the second supply part 435, and the mounting part 440 have been described in the second embodiment, detailed descriptions will be omitted.

For example, the mounting part 440 may mount the substrate 200 so as to be inclined at an obtuse angle θ2 with respect to the horizontal plane of the chamber 410, that is, the ground. An angle θ2 between the ground and the substrate 200 may exceed 90 degrees.

To this end, the first and second guide portions (442 and 443 of FIG. 12) of the mounting part 440 may be provided in the chamber 410 to be inclined at an obtuse angle θ2 with respect to the ground. Therefore, the substrate 200 is inserted into the first and second guide portions (442 and 443 in FIG. 12) and guided along the inclined direction along the first and second guide portions (442 and 443 in FIG. 12) such that it can be fixed to the third guide portion (444 in FIG. 12).

When the substrate 200 is mounted on the mounting part 440, the assembly surface 207 of the substrate 200 can look upward, opposite to the ground.

When the substrate 200 is disposed to be inclined at an obtuse angle θ2 with respect to the ground, the light emitting devices 150 supplied to the chamber 410 from the upper side of the chamber 410 may fall toward the assembly surface 207 of the substrate 200 such that it can be assembled into the assembly hole 203 of the substrate 200. Accordingly, more and more light emitting devices 150 can be aligned per pixel such that higher luminance can be obtained. That is, the light emitting devices 150 may be assembled to the substrate 200 artificially and by free fall by the magnet module 450, and the substrate 200 may be disposed to have an obtuse angle θ2 with respect to the ground. Accordingly, more and more light emitting devices 150 can be assembled on the substrate 200 such that improved high luminance can be implemented.

Meanwhile, the sixth embodiment may be equally applied to the first and third embodiments.

The Seventh Embodiment

Figure 27:
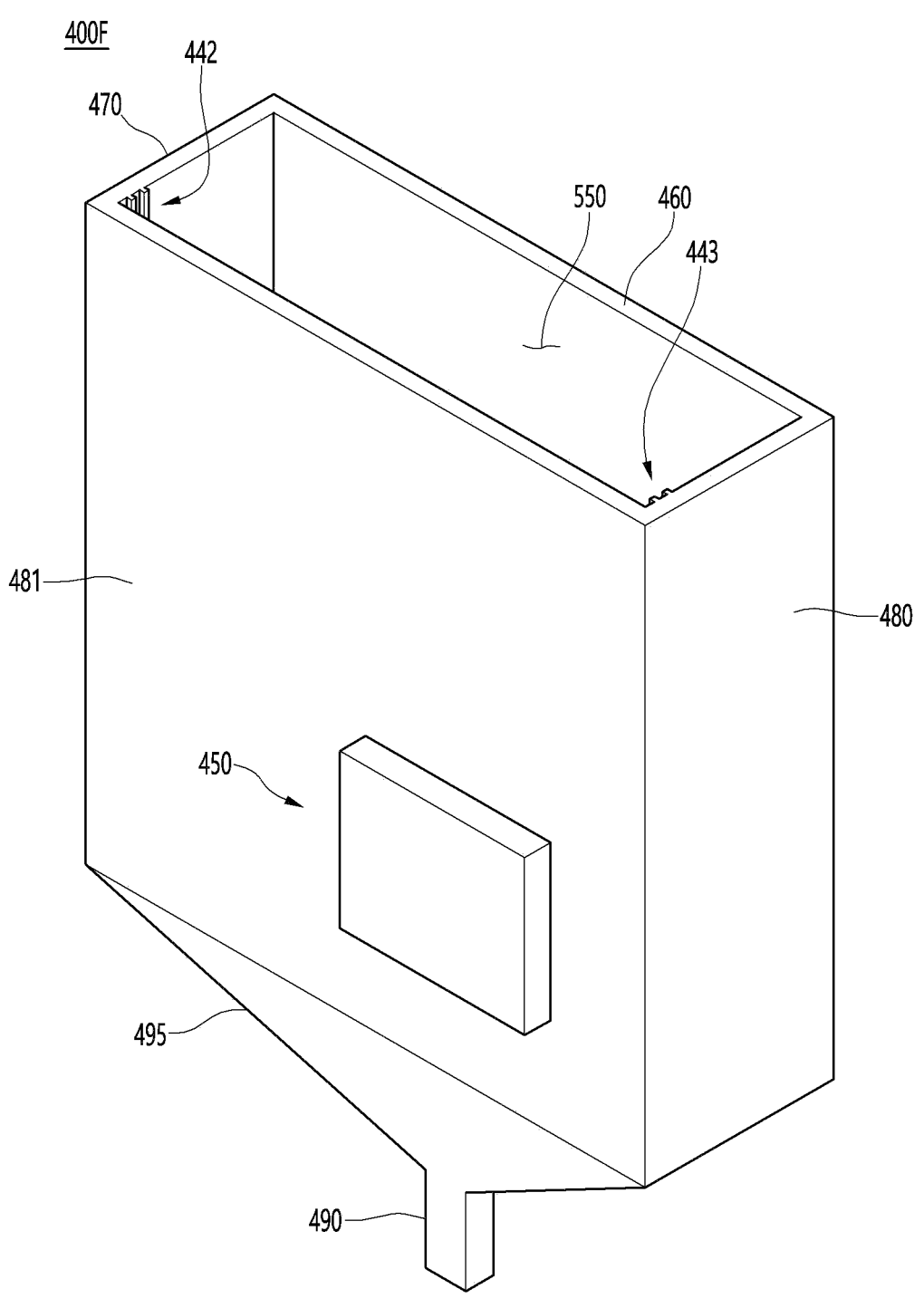
FIG. 27 is a side cross-sectional view showing a self-assembling device according to the seventh embodiment.

FIG. 27 is a side cross-sectional view showing a self-assembling device according to the seventh embodiment.

The seventh embodiment is similar to the first embodiment except for the fourth partition 481. In the seventh embodiment, the same reference numerals are assigned to elements having the same functions, shapes and/or structures as those in the first embodiment, and detailed descriptions will be omitted.

Referring to FIG. 27, the self-assembly apparatus 400F according to the seventh embodiment includes a chamber 410, a first supply part (420 in FIG. 13), a second supply part 430, a mounting part (440 in FIG. 11), and a magnet module 450.

Since the first supply part 420, the second supply part 430, the mounting part 440, and the magnet module 450 have been described in the first embodiment, detailed descriptions will be omitted.

The chamber 410 may comprise a first barrier rib 460, a second barrier rib 470, a third barrier rib 480 and a fourth partition 481.

An accommodation space 550 may be formed by the first barrier rib 460, the second barrier rib 470, the third barrier rib 480, and the fourth partition 481. The fluid 510 may be filled in the accommodating space 550 of the chamber 410. Accordingly, the fluid 510 may be in contact with an inner surface of each of the first barrier rib 460, the second barrier rib 470, the third barrier rib 480 and the fourth partition 481 and a bottom portion (485 in FIG. 12) of the chamber 410.

The fourth partition 481 is disposed on a first side of the chamber 410, the first barrier rib 460 is disposed on a second side of the chamber 410, and the first and second sides face each other. For example, each of the fourth barrier rib 481 and the first barrier rib 460 may be disposed along the X-axis direction. For example, the inner surface of the fourth barrier rib 481 and the inner surface of the first barrier rib 460 may be parallel to each other, but this is not limited thereto.

The magnet module 450 may be disposed on an outer surface of the fourth barrier rib 481. For example, the magnet module 450 may be spaced apart from the outer surface of the fourth barrier rib 481 and rotate vertically and horizontally parallel to the fourth barrier rib 481. Since the substrate 200 is disposed parallel to the fourth barrier rib 481, the magnet module 450 may also rotate in parallel with the substrate 200. Therefore, since the strength of the magnetic field formed by a plurality of magnets of the magnet module 450 equally extends to the entire region of the assembly surface 207 of the substrate 200, the light emitting devices 150 assembled for each pixel of the substrate 200 can be constant such that uniform luminance can be secured for each pixel.

The second barrier rib 470 may be disposed on the third side of the chamber 410, and the third barrier rib 480 may be disposed on the fourth side of the chamber 410. The third side and the fourth side may face each other. For example, each of the second barrier rib 470 and the third barrier rib 480 may be disposed along the Y-axis direction. For example, the inner surface of the second barrier rib 470 and the inner surface of the third barrier rib 480 may be parallel to each other, but this is not limited thereto.

The mounting part 440 may be disposed within the chamber 410. For example, the mounting part 440 may be located between the fourth barrier rib 481 and the first barrier rib 460. For example, the mounting part 440 may be located between the fourth barrier rib 481 and the center of the chamber 410.

For example, the mounting part 440 may be installed in the chamber 410 adjacent to the fourth barrier rib 481. As shown in FIGS. 12 and 14, the mounting part 440 may comprise a first guide portion 442, a second guide portion 443 and a third guide portion 444. The guide part 441 may be configured by the first guide portion 442, the second guide portion 443, and the third guide portion 444. For example, the first guide portion 442 may be disposed on an inner surface of the second barrier rib 470 and the second guide portion 443 may be disposed on the inner surface of the third barrier rib 480. The first guide portion 442 and the second guide portion 443 may be formed long along the Z-axis direction.

In this case, the substrate 200 may be inserted into the first guide portion 442 and the second guide portion 443 from the upper side of the chamber 410, guided along a lower direction of the chamber 410, and then fixed to the third guide portion 444. When the substrate 200 is mounted on the mounting part 440, the fluid 510 may be separated. That is, a first fluid filled between the substrate 200 and the first barrier rib 460 and a second fluid filled between the substrate 200 and the fourth barrier rib 481 may be separated. When the substrate 200 is detached from the mounting part 440 after the light emitting devices 150 are assembled to the substrate 200, the first fluid and the second fluid separated from each other by the substrate 200 may merge. Accordingly, the fluid 510 filled in the chamber 410 may be separated or merged as the substrate 200 is mounted or detached from the mounting part 440.

The description of the chamber 410 not described above can be easily understood from the first embodiment.

In the first to sixth embodiments, the fourth barrier rib 481 of the seventh embodiment is not provided such that the fluid 510 in the chamber 410 is discharged to the outside before the substrate 200 is detached from the mounting part 440.

In contrast, in the seventh embodiment, the fourth barrier rib 481 is provided, and when the accommodation space 550 formed by the first to fourth barrier ribs 481 of the chamber 410 is filled with the fluid 510, even if a plurality of substrate 200 is sequentially mounted on and detached from the mounting part 440, the fluid 510 in the chamber 410 is not discharged to the outside such the process time can be drastically reduced.

In FIGS. 11 to 27, black hatching of each of the first supply part 420, the second supply part 430, and the collection part 490 indicates that the valve is closed, and white hatching white indicates that the valve is open.

Meanwhile, the seventh embodiment may be equally applied to the second to sixth embodiments.

The above detailed description should not be construed as limiting in all respects and should be considered illustrative. The scope of the embodiment should be determined by reasonable interpretation of the appended claims, and all changes within the equivalent range of the embodiment are included in the scope of the embodiment.

INDUSTRIAL APPLICABILITY

The embodiment can be adopted in the display field for displaying images or information.

The invention claimed is:

1. A self-assembly apparatus, comprising:

a chamber;

at least one first supply part configured to supply a fluid to the chamber;

a mounting part disposed on a first side of the chamber to mount a substrate to be inclined with respect to a horizontal plane of the chamber, the substrate having an assembly surface;

a first barrier rib on a second side of the chamber;

a second barrier rib on a third side of the chamber; and a third barrier rib on a fourth side of the chamber, and configured to face the second barrier rib; and a magnet module disposed on an opposite surface of the substrate opposite to the assembly surface of the substrate, wherein the mounting part is configured to:

insert the substrate into an upper side of the chamber, guide the inserted substrate from the upper side of the chamber toward a lower side of the chamber, and fix the guided substrate to the lower side of the chamber.

2. The self-assembly apparatus of claim 1, wherein the mounting part is configured to mount the substrate so that the assembly surface is located vertically with respect to the horizontal plane of the chamber.

3. The self-assembly apparatus of claim 1, wherein the mounting part is configured to mount the substrate so that the assembly surface is inclined at an acute angle with respect to the horizontal plane of the chamber.

4. The self-assembly apparatus of claim 1, wherein the mounting part is configured to mount the substrate so that the assembly surface is inclined at an obtuse angle with respect to the horizontal plane of the chamber.

5. The self-assembly apparatus of claim 1, wherein a second length of each of the second barrier rib and the third barrier rib is smaller than a first length of the first barrier rib.

6. The self-assembly apparatus of claim 1, wherein the mounting part comprises a guide part configured to guide the substrate from the upper side of the chamber to the lower side of the chamber.

7. The self-assembly apparatus of claim 6, wherein the guide part comprises:

a first guide portion on the second barrier rib;

a second guide portion on the third barrier rib; and a third guide portion on a bottom portion of the chamber.

8. The self-assembly apparatus of claim 7, wherein the guide part further comprises:

at least one sealing part disposed on the first to third guide portions.

9. The self-assembly apparatus of claim 6, wherein an upper side of the guide part is positioned equal to or higher than an upper side of the substrate.

10. The self-assembly apparatus of claim 1, further comprising:

a plurality of second supply parts configured to supply light emitting devices to the chamber.

11. The self-assembly apparatus of claim 10, wherein the at least one first supply part and the plurality of second supply parts are installed on the first barrier rib.

12. The self-assembly apparatus of claim 11, wherein the magnet module comprises:

a plurality of magnets corresponding to the plurality of second supply parts.

13. The self-assembly apparatus of claim 1, further comprising:

a fourth barrier rib disposed on the first side of the chamber and configured to face the first barrier rib, wherein the mounting part is located between the fourth barrier rib and the first barrier rib.

14. The self-assembly apparatus of claim 13, wherein the magnet module is disposed on an outer surface of the fourth barrier rib.

15. A self-assembly apparatus comprising:

a chamber;

at least one first supply part configured to supply a fluid to the chamber;

a mounting part disposed on a first side of the chamber to mount a substrate to be inclined with respect to a horizontal plane of the chamber, the substrate having an assembly surface;

a collection part on a lower side of the chamber;

a collection induction part disposed between the lower side of the chamber and the collection part; and a magnet module disposed on an opposite surface of the substrate opposite to the assembly surface of the substrate, wherein the mounting part is configured to:

insert the substrate into an upper side of the chamber, guide the inserted substrate from the upper side of the chamber toward the lower side of the chamber, and fix the guided substrate to the lower side of the chamber.

16. The self-assembly apparatus of claim 15, wherein the collection induction part has a shape in which a width decreases from the upper side of the chamber to the lower side of the chamber.

17. The self-assembly apparatus of claim 7, wherein the first side of the chamber has an open area, and wherein the guide part is installed around the open area.

18. The self-assembly apparatus of claim 13, wherein the substrate mounted on the mounting part is located between the fourth barrier rib and the first barrier rib.

19. A self-assembly apparatus, comprising:

a chamber having a first side and a second side facing the first side;

at least one first supply part at the second side of the chamber, and configured to supply a fluid into the chamber;

at least one second supply part at the second side of the chamber, and configured to supply a plurality of light emitting devices to the chamber;

a collection part on a lower side of the chamber;

an assembly substrate at the first side of the chamber, and having an assembly surface configured to receive the plurality of light emitting devices; and a magnet module adjacent to the substrate at a location outside of the chamber.

20. The self-assembly apparatus of claim 19, further comprising a mounting part configured to support the assembly substrate when the fluid is placed in the chamber.

* * * * *